(12) United States Patent
Brandt

(10) Patent No.: US 9,326,406 B2
(45) Date of Patent: Apr. 26, 2016

(54) TRANSPORTABLE DEPLOYABLE DISPLAY APPARATUS

(71) Applicant: Thomas Brandt, Orlando, FL (US)

(72) Inventor: Thomas Brandt, Orlando, FL (US)

(73) Assignee: Event Technology, LLC, Orlando, FL (US)

( * ) Notice: Subject to any disclaimer, the term of this patent is extended or adjusted under 35 U.S.C. 154(b) by 158 days.

(21) Appl. No.: 13/786,115

(22) Filed: Mar. 5, 2013

(65) Prior Publication Data

US 2013/0279090 A1    Oct. 24, 2013

Related U.S. Application Data

(60) Provisional application No. 61/606,872, filed on Mar. 5, 2012.

(51) Int. Cl.
| | | |
|---|---|---|
| *H05K 7/00* | (2006.01) | |
| *A45C 9/00* | (2006.01) | |
| *H05K 5/00* | (2006.01) | |

(Continued)

(52) U.S. Cl.
CPC .. *H05K 7/00* (2013.01); *A45C 9/00* (2013.01); *A47B 81/06* (2013.01); *F16M 11/04* (2013.01); *F16M 11/105* (2013.01); *F16M 11/18* (2013.01); *F16M 11/2028* (2013.01); *F16M 11/24* (2013.01); *F16M 11/42* (2013.01); *H04N 5/655* (2013.01); *H05K 5/0004* (2013.01); *H05K 5/0017* (2013.01); *H05K 7/14* (2013.01); *A45C 5/04* (2013.01); *A45C 7/0045* (2013.01); *A45C 2005/037* (2013.01); *A45C 2200/15* (2013.01); *F16M 2200/027* (2013.01)

(58) Field of Classification Search
CPC .............................. F16M 11/105; H04N 5/28
See application file for complete search history.

(56) References Cited

U.S. PATENT DOCUMENTS 2,290,090 A * 7/1942 Bracken ........................ 190/119
3,298,478 A * 1/1967 Soprani ........................... 190/11

(Continued)

FOREIGN PATENT DOCUMENTS

| NL | EP 1595474 A1 * 11/2005 | ............. A47B 81/06 |
|---|---|---|
| SE | EP 0237697 A2 * 11/1987 | |
| WO | WO2007005245 | 1/2007 |

OTHER PUBLICATIONS

Calzone Case Co., Monitor and Display, http://web.archive.org/web/20120116174751/http:/www.calzonecase.com/styles/monitor-and-display/, Jan. 16, 2012.*

*Primary Examiner* — Joshua J Michener
*Assistant Examiner* — Chiedu Chibogu
(74) *Attorney, Agent, or Firm* — Stephen C. Thomas

(57) ABSTRACT

The present invention comprises an apparatus for protecting and providing a stand for a display, which may be an electronic display, which resolves the issues of the prior art in a novel, self-contained, easy to deploy manner. The apparatus of the invention is comprised of a transportation case configured to be utilized as part of the stand when it is desired to support a display, deployable elements contained in the transportation case that enable easy and rapid deployment of the stand and display, and other elements, including, optionally, the display itself. The transportation case is configured to accept and protect a display during shipment. In accordance with one embodiment of the present invention, the invention includes the display itself. When deployed for viewing, the display stand may be covered by a decorative skirt. The apparatus is a compact, deployable, self-contained unit for display and shipping.

18 Claims, 26 Drawing Sheets

(51) Int. Cl.

| | | |
|---|---|---|
| *H05K 7/14* | (2006.01) | |
| *F16M 11/04* | (2006.01) | |
| *F16M 11/18* | (2006.01) | |
| *F16M 11/20* | (2006.01) | |
| *A47B 81/06* | (2006.01) | |
| *F16M 11/10* | (2006.01) | |
| *F16M 11/24* | (2006.01) | |
| *F16M 11/42* | (2006.01) | |
| *H04N 5/655* | (2006.01) | |
| *A45C 5/03* | (2006.01) | |
| *A45C 5/04* | (2006.01) | |
| *A45C 7/00* | (2006.01) | |

(56) References Cited

U.S. PATENT DOCUMENTS

| | | | | |
|---|---|---|---|---|
| 3,655,215 A * | 4/1972 | Becklin | 280/79.2 | |
| 3,905,662 A * | 9/1975 | Richmond | 312/249.8 | |
| 4,118,048 A * | 10/1978 | Spranger et al. | 280/47.35 | |
| 4,322,905 A | 4/1982 | Kruse | | |
| 4,747,644 A | 5/1988 | Gallery et al. | | |
| 5,513,066 A * | 4/1996 | Berman | 361/625 | |
| 5,678,716 A * | 10/1997 | Umiker | 220/4.26 | |
| 5,762,168 A * | 6/1998 | Miyoshi | 190/18 A | |
| 5,797,612 A * | 8/1998 | Buccioni | 280/47.26 | |
| 5,866,829 A * | 2/1999 | Pecoraro | 84/177 | |
| 5,941,002 A | 8/1999 | Rusin | | |
| 5,950,779 A * | 9/1999 | Miyoshi | 190/18 A | |
| 6,129,231 A * | 10/2000 | Hsiao et al. | 220/345.2 | |
| 6,161,320 A | 12/2000 | Peterson | | |
| 6,229,698 B1 * | 5/2001 | Harvey | 361/679.55 | |
| 6,585,214 B1 * | 7/2003 | Dittmer | 248/370 | |
| 6,783,198 B2 * | 8/2004 | Rudd et al. | 312/319.8 | |
| 6,902,243 B2 * | 6/2005 | Bober | 312/306 | |
| 6,964,420 B1 * | 11/2005 | Ghanizadeh et al. | 280/47.131 | |
| 7,044,423 B2 * | 5/2006 | Bober et al. | 248/188.4 | |
| 7,937,810 B2 | 5/2011 | Hu | | |
| 8,104,205 B2 | 1/2012 | Hillstrom et al. | | |
| 8,534,779 B2 * | 9/2013 | Schaaf | 312/272.5 | |
| 8,800,455 B2 * | 8/2014 | Monroe | 108/15 | |
| 8,910,680 B1 * | 12/2014 | Jacobs | A47B 81/06 150/165 | |
| 2002/0101139 A1 * | 8/2002 | Lee | 312/196 | |
| 2002/0139626 A1 * | 10/2002 | Rudd et al. | 190/11 | |
| 2004/0164659 A1 * | 8/2004 | Bober | 312/312 | |
| 2005/0137942 A1 * | 6/2005 | LaFleur | 705/27 | |
| 2005/0199459 A1 * | 9/2005 | Harvey | 190/108 | |
| 2006/0261207 A1 * | 11/2006 | Woodruff et al. | 242/473.3 | |
| 2007/0262209 A1 * | 11/2007 | She et al. | 248/122.1 | |
| 2008/0078897 A1 * | 4/2008 | Smith | 248/218.4 | |
| 2009/0284963 A1 * | 11/2009 | Intravatola | 362/190 | |
| 2010/0231101 A1 * | 9/2010 | Rubin | 312/237 | |
| 2010/0268079 A1 * | 10/2010 | Woo et al. | 600/437 | |
| 2012/0145592 A1 * | 6/2012 | Libuda | 206/736 | |

\* cited by examiner

TRANSPORTABLE DEPLOYABLE DISPLAY APPARATUS

CROSS REFERENCE TO RELATED APPLICATIONS

This non-provisional patent application is respectfully filed with the United States Patent and Trademark Office claiming the benefit of U.S. Provisional Application Ser. No. 61/606,872, filed in the USPTO on Mar. 5, 2012, which is herein incorporated by reference in its entirety.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISK

Not applicable.

BACKGROUND OF THE INVENTION

1. Field of the Invention

The field of the invention relates generally to deployable transportable display stands; more specifically, to deployable display stands that are compact, self-contained, require minimal setup and break down time, and are adapted to be utilized as transportation containers such that a display, such as a flat screen video display, can be safely transported and, upon arrival at a destination where it is desired to erect the display for use, the structure of the invention allows the display to be extended beyond the exterior dimensions of the transportation case such that the display is clearly visible and ready for use. Such stands, for instance, are utilized for digital signage used, for example, at trade shows, conferences, seminars, symposiums, sporting events, concerts and the like for the holding of displays for providing information to attendees. Usually this information comprises schedule information, advertisements, facilities maps or any other information desired. The field of the invention also relates to point-of-purchase or point-of-sale displays. Such displays are often used at major retail stores in order to advertise brand marketing, specials, and other information on the sales floor. The present invention allows for quick and efficient reconfiguration and movement of the display to any location the user desires, and allows for vertical height adjustment so that the display can be positioned at a height that meets certain requirements such as the American with Disabilities Act requirements or other rules, regulations and laws.

2. Background Art

Display stands have been in general use for many years. Typically, such stands are separate units that extend or are permanently extended to accept the mounting of a display or screen upon which information can be displayed. When utilized for an event, for example a conference or trade show, such display stands are typically carried and shipped separately from the display itself and are either shipped with or without a protective case. This results in shipping costs for both the display and the stand, and lead to increased risk that one or the other may not actually make it to the trade show. As such stands are typically re-used numerous times over their lifetime, is it desirable that they be shipped and carried in some kind of carrying case in order to protect them from shipping abuse and the general wear and tear associated with repeated deployment.

Furthermore, displays themselves are generally shipped and carried in some kind of case or container to provide protection during shipment or movement to the next event. Such protection for displays has become increasingly necessary as the cost of displays, especially electronic displays which may comprise, for example, Liquid Crystal Display (LED), plasma, Light Emitting Diode (LED) or other electronic display technology has increased. Still further, such electronic displays, also known as digital signage, are generally more susceptible to damage due to the impact, shock and vibration encountered during typical shipping activity. The utilization of shipping containers or cases, while affording protection to the stand and/or display, increases the number of separate components that must be tracked, stored and accounted for during the time the display is being utilized. Such shipping cases may, for instance, be stored in a back room of the convention center along with other shipping containers and cases, which requires that the user secure such storage space in advance in order to reduce the risk that the space may not be available at the show. In such situations, the display, or digital sign, and display stand shipping cases may become lost, stolen or mixed with cases belonging to others, causing delay and even loss of the cases themselves, in turn increasing the risk and costs of moving the displays and display stands to the next event.

Digital signage is a form of electronic display that shows television programming, menus, information, advertising and other messages. Digital signs (such as LCD, LED, plasma displays, or projected images) can be found in public and private environments, such as retail stores, hotels, restaurants and corporate buildings. Digital signage displays are most usually controlled by personal computers or servers by way of software programs. Advertising using digital signage is a form of out-of-home advertising in which video content, advertisements and messages are displayed on digital signs with a common goal of delivering targeted messages to specific locations at specific times. This is often called "digital out of home" or abbreviated as DOOH. Digital signage offers a significant advantage over other means of communication, such as posters or other static displays, because content that updates frequently can be digitally updated on a digital sign, saving the cost of printing and, perhaps more importantly, allowing for instantaneous information updates. Digital signage also has the ability to be interactive with imbedded touch screens, movement detection and image capture devices. While the term "digital signage" has taken hold throughout most of the world, some companies and organizations prefer to use the terms "narrowcasting", "screen media", "place-based media", "digital merchandising", "digital media networks", "digital out-of-home" or "captive audience networks". Use of the invention as a means to safely transport, protect and display digital signage is but one example of the utility of the apparatus of the invention.

A need exists in the art for a transportation case comprising features that allow a display, such as a flat screen monitor, to be securely transported and then, upon arrival at a destination, to be supported for display, preferably with a means for both rotating the display and vertically translating the display to a desired height, without the need for separate hardware or equipment.

One example of a portable display of the prior art is U.S. Pat. No. 7,747,6044 (Gallery et al. 1988). This U.S. patent teaches a portable display stand comprising a base member plate provided with a mounting plate so that wheels may be mounted in an operational or stored position on the base member with the base member also being provided with a support system. A plurality of sidewall panels are provided and are hingedly connected together so that they may be moved to an operational position and supported on the support system or moved to a storage position. A top member plate is provided and has a channel system for receiving a portion of the sidewall panels to be supported thereby. A carrying case is provided and has walls defining a cavity for holding the base member plate with the wheels in a stored position, the plurality of sidewall panels in a stored position and the top member plate. Gallery et al. however does not provide for a single apparatus that mounts, rotates, provides vertical extension for a display and provides transport protection for a display.

Another example of a portable display stand of the prior art is U.S. Pat. No. 4,322,905 (Kruse 1982). This U.S. patent teaches a portable display unit for display of advertising material or other informational or decorative material on changeable display cards and for storage of other display cards. The display unit includes a rectangular boxlike housing convertible between a collapsed or closed and portable configuration and an erect or a display configuration supported on a stand. At least one wall of the housing is comprised as a removable panel to expose a picture type frame surrounding a viewing area to be filled by the display card to be viewed. A retractable handle is provided for transport of the unit from place to place in the collapsed or closed configuration. The present art of shipping containers and display stands for various displays therefore lacks a solution that solves the issues of display and display stand protection, rapid easy deployment and teardown, and tracking and storage of display cases. Kruse however does not provide for a single apparatus that mounts a display, rotates a display to a desired orientation, provides vertical extension for a display and provides transport protection for a display.

An example of a static display of the prior art is U.S. Pat. No. 5,941,002 (Rusin 1999). This U.S. patent teaches a stadium signage system that is provided for displaying promotional or informational signs at field events such as soccer games played in a stadium having a grandstand facing a playing field. A support frame is supported in an upright position by a pair of mounting stands. The support frame has a bottom rail and a top rail and is positioned between the grandstand and the playing field. A first channel is connected to the bottom rail and has a first upward member confronting a first side of the bottom rail wherein a first space is defined between the first upward member and the first side of the bottom rail. The first channel also has a second upward member confronting a second side of the bottom rail wherein a second space is defined between the second upward member and the second side of the bottom rail. A first ad panel is inserted into the first space and faces the playing field. A second ad panel is inserted into the second space and faces the grandstand. A second channel is releasably secured to the top rail and has a first downward member and a second downward member. The downward members retain top edges of the ad panels against the top rail. Rusin however does not provide for a single apparatus that mounts a display, rotates a display to a desired orientation, provides vertical extension for a display and provides transport protection for a display.

Another example of the prior art is U.S. Pat. No. 6,161,320 (Peterson 2000). This U.S. patent teaches a portable display system is provided for use by exhibitors at tradeshow and other events that is comprised of a plurality of display stands and display-stand connectors. The individual display stands are comprised of a free-standing frame and a rollable panel that is attached to the frame for viewing. Multiple display stands may be easily connected and arranged relative to each other to create larger displays, for example, a substantially-curved wall or a triangular tower. The exhibitor has the flexibility of using the display stands individually or connected together. Peterson however does not provide for a single apparatus that mounts a display, rotates a display to a desired orientation, provides vertical extension for a display and provides transport protection for a display.

BRIEF SUMMARY OF THE INVENTION

The present invention overcomes the shortcomings of the prior art by providing an apparatus that mounts a display, rotates a display to a desired orientation, provides vertical extension for a display and provides transport protection for a display. The present invention comprises an apparatus for protecting and providing a stand for a display, which may, for example, be an element of digital signage, which resolved the issues of the prior art in a novel, self-contained, easy to deploy manner. The apparatus of the invention, in a preferred embodiment, is comprised of a transportation case that is configured to be utilized as part of the stand when it is desired to utilize a display. A preferred embodiment comprises a vertical slide, a rotating display mount, an actuator and a separable transportation case which are configured as described herein to operate both as a transportation case and an adjustable display stand. The transportable deployable display apparatus of the invention enables easy and rapid deployment of the stand and display, and other elements, including, optionally, the display, or digital sign, itself. The transportation case may be quickly and efficiently opened and the display rotated into position and vertically positioned as a user desires.

It is one aspect of the invention that the apparatus provides a smaller and more compact solution for transportation containers than the prior art, which in some instances represents a fifty percent reduction in the size of the container utilized for transportation and shipping. The apparatus of the invention also exhibits lighter weight than prior art solutions because of its compact nature. The smaller size and lighter weight result in cost savings related to shipping and handling, as typical freight companies charge by weight and also by dimension.

In accordance with one embodiment of the present invention, the claimed invention may include the display itself within its scope.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating the preferred embodiments of the invention and are not to be construed as limiting the invention. In the drawings:

FIG. 10 depicts a perspective view of an alternate embodiment of the invention, showing the display in rotation.

DETAILED DESCRIPTION OF THE INVENTION

The following documentation provides a detailed description of the invention. While a preferred embodiment is disclosed in detail herein, it will be apparent to a person of ordinary skill in the art that multiple embodiments fall within the scope of the invention as described herein. The limitations of the prior art are overcome by the present invention, in that the invention is a self-contained shipping, storage and display apparatus that allows for easy setup and teardown, security in transportation, and eliminates separate components that may be stolen or lost in use.

Figure 1:
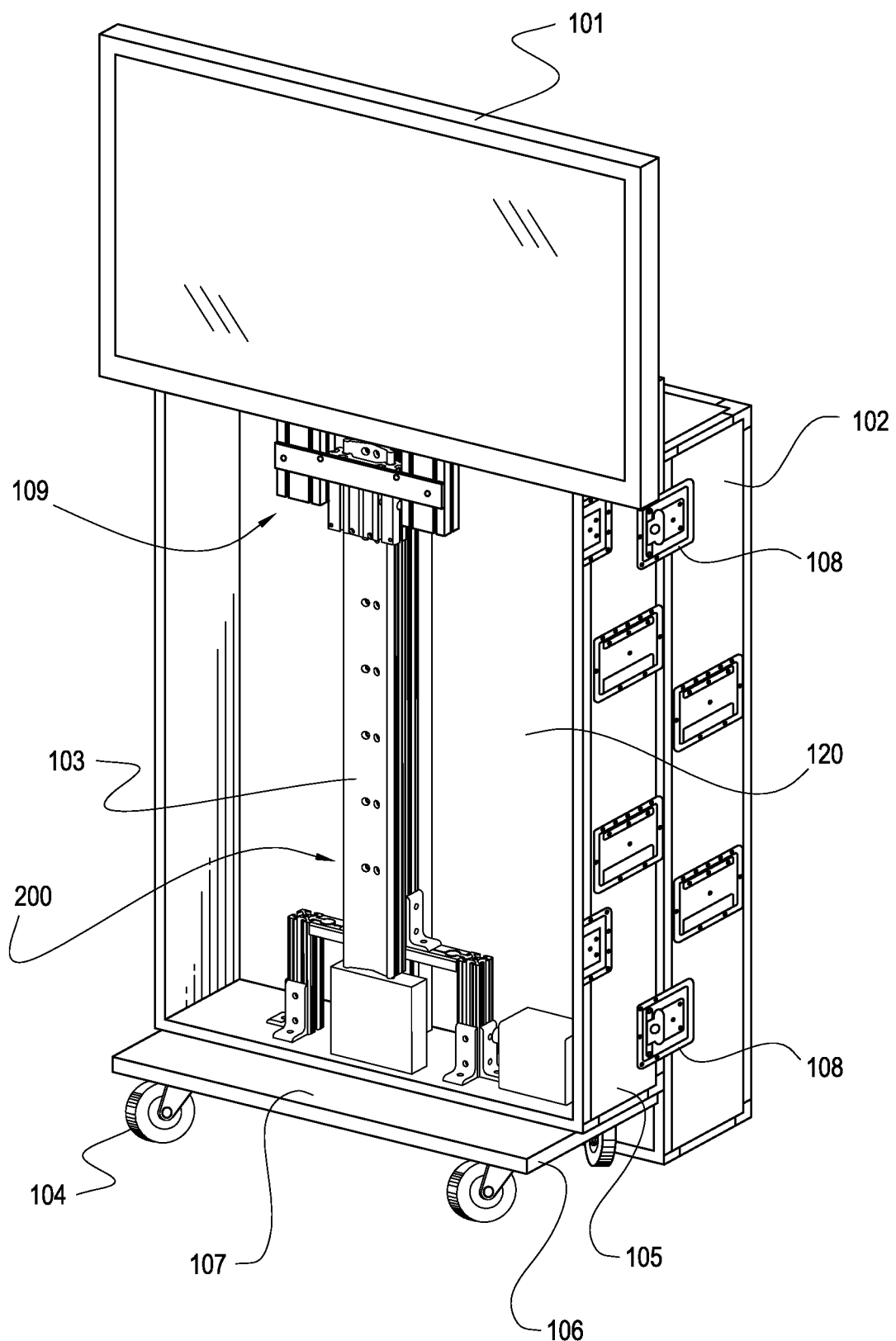
FIG. 1 depicts a perspective view of a preferred embodiment of the invention in which the case of the invention has been opened and a display has been rotated and vertically extended into position, where the display extends above the top of the case.

Referring now to FIG. 1, a preferred embodiment of the apparatus of the invention is shown in perspective view. A transportation case comprised of a first transportation case half 105 and a second transportation case half 102 has been opened, and second transportation case half 102 has been fastened to said first transportation case half 105 by the case attaching latches 108 shown in FIG. 1. Opening the transportation case results in two separate transportation case halves as shown and herein referred to as a first transportation case half 105 and second transportation case half 102, each of which have an opening 120 whereby first transportation case half 105 and second transportation case half 102 may be releasably attached with the openings together to form a complete, enclosed shipping container. A view of the complete shipping container in the transportation position is shown further in FIG. 8. Referring back to FIG. 1, the opening 120 of first transportation case half 105 is shown. Preferably, the invention also comprises a plurality of case attaching latches 108 shown in FIG. 1. First transportation case half 105 may also have attached to an outer bottom surface thereof a support plate 106 which has an upper surface and a lower surface. Attached to the lower surface of support plate 106 may be at least one caster 104, or, preferably, a plurality of casters each having an upper mounting surface that is attached to the bottom surface of support plate 106. The means of attachment of support plate 106 to the outer bottom surface of first transportation case half 105 may be any means known in the art including threaded fasteners, rivets, chemical bonding, or any other means of attachment known in the art for attaching one surface to another. The means of attachment of upper mounting surface of casters 104 to the bottom surface of plate 106 may be any means known in the art including threaded fasteners, rivets, chemical bonding, or any other means of attachment known in the art for attaching one surface to another. Casters 104 also comprise rolling elements which are shown as wheels in FIG. 1 so that the transportable deployable display apparatus of the invention may be rolled and rotated into a desired position, for example, on a convention floor. It is to be noted that while caster rolling elements are shown as wheels in the figures, other equivalent casters known in the art, such as ball casters which utilize ball rolling elements, are within the scope of the claims, so that casters 104 need not comprise wheels alone as a rolling element, but may comprise any rolling element known to be used as a caster. The outline of support plate 106 may take any shape desired by the user, but preferably the outline of support plate 106 does not extend beyond the bottom surface created when first transportation case half 105 and the second transportation case half 102 are assembled together in the transportation position shown in FIG. 8. In a best mode of the invention, two casters may be mounted along support plate front edge 107 which allows the entire assembled unit to be slightly tipped towards the casters, enabling the assembled and deployed unit to be easily rolled to a new location or rotated so that the display is in a position and location for optimum viewing. Any number of casters may be used, as desired by the user. Support plate 106 and casters 104 may be removed, if desired, for ease of shipping, but in a preferred use support plate 106 and casters 104 remain in place during shipping to allow for ease of movement of the transportable deployable display apparatus of the invention.

Figure 8:
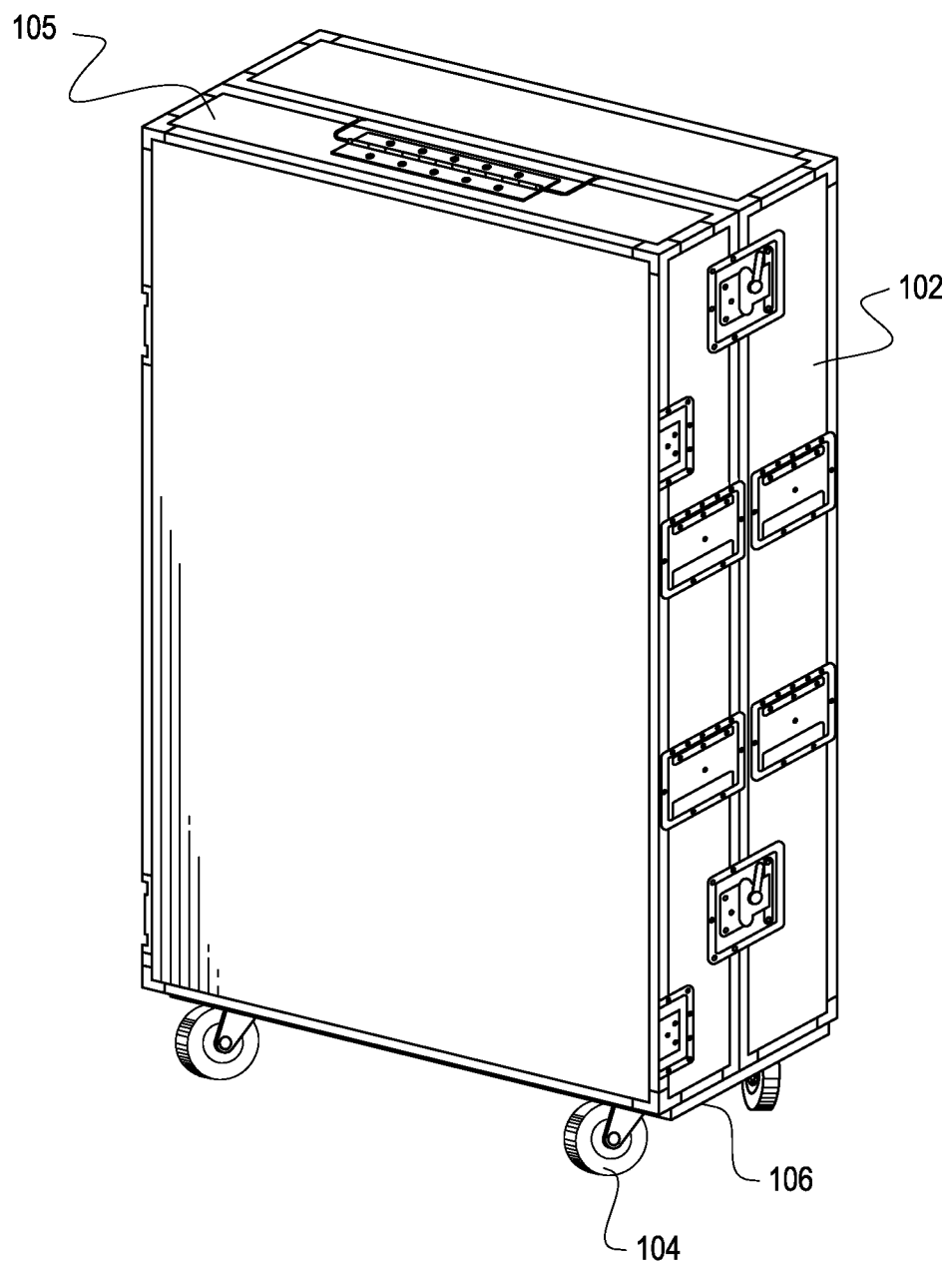
FIG. 8 depicts a perspective view of a preferred embodiment of the invention in which the display has been lowered and rotated into position for transportation, storage or shipping, and the two halves of the case have been assembled together into the transportation position.

Vertical slide assembly 200 is also shown in FIG. 1, as is display 101 and carriage assembly 109. Display 101 is translatable vertically and rotatable by the operation of carriage assembly 109 and vertical slide assembly 200 as further described herein. The apparatus of the invention may or may not include display 101. The display may be a static display such as a printed surface, or any object that is desired to be displayed; or preferably, display 101 may be an electronic display as is depicted in the figures of the drawings, which may be a Liquid Crystal Display (LCD), a Light Emitting Diode (LED) display, a plasma display, or any other electronic display. Display 101 may also, in less preferred embodiments, be an analog electronic display. Any display, electronic or otherwise, may be utilized as long as it fits within case halves 102 and 105 when they are configured for shipping in the transportation position as depicted in FIG. 8.

Also depicted in FIG. 1, shown protruding slightly beneath the lower edge of display 101, is the carriage assembly 109 which may be comprised of several elements assembled together and which slides vertically up and down vertical slide rail 103, which is a part of vertical slide assembly 200. Carriage assembly 109 is shown in additional detail in FIGS. 4, 5, and 6.

Figure 4:
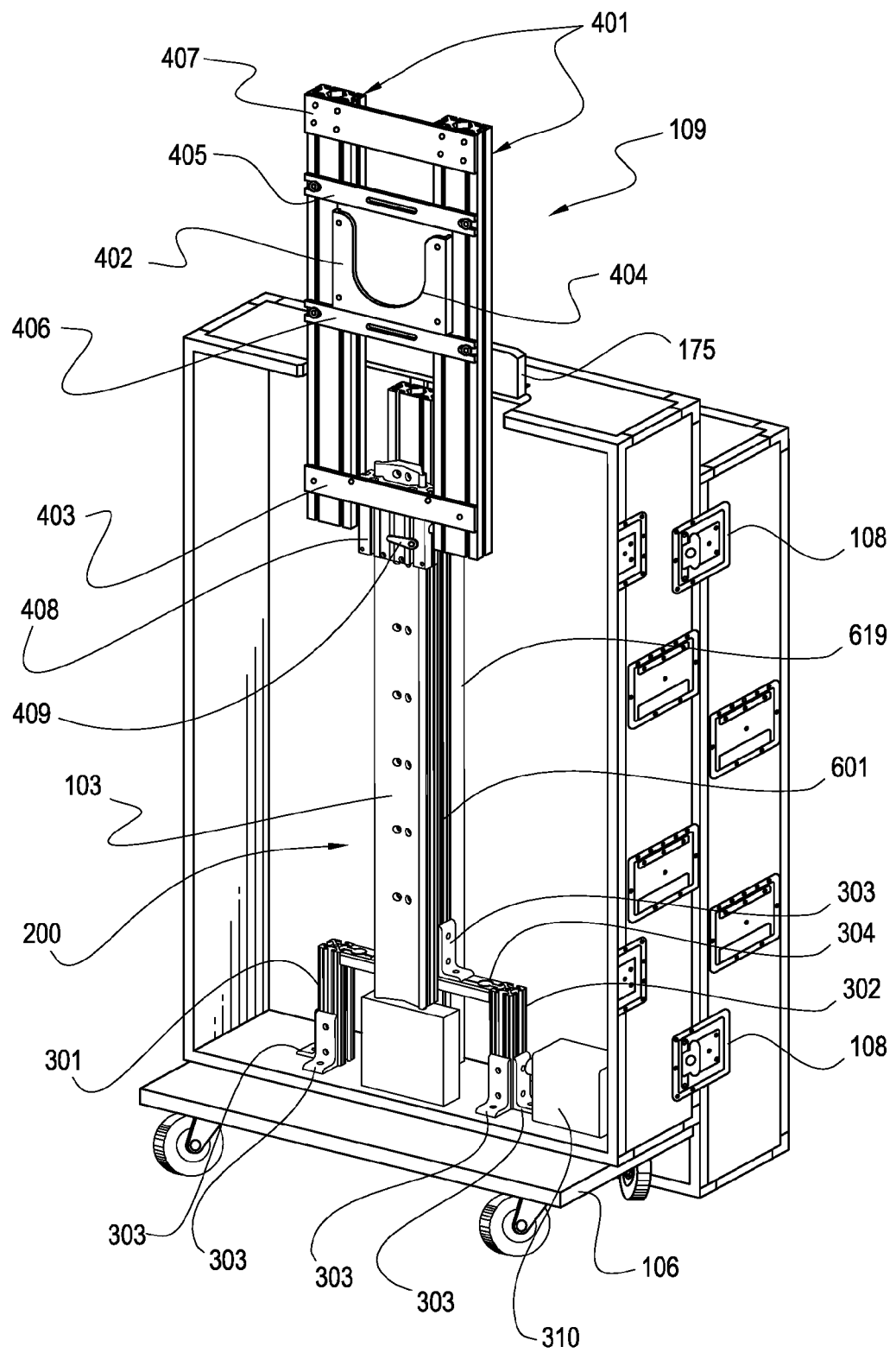
FIG. 4 depicts a perspective view of a preferred embodiment of the apparatus of the invention with the display removed for clarity, depicting the vertical slide and track elements with the slide in a raised position.
Figure 5:
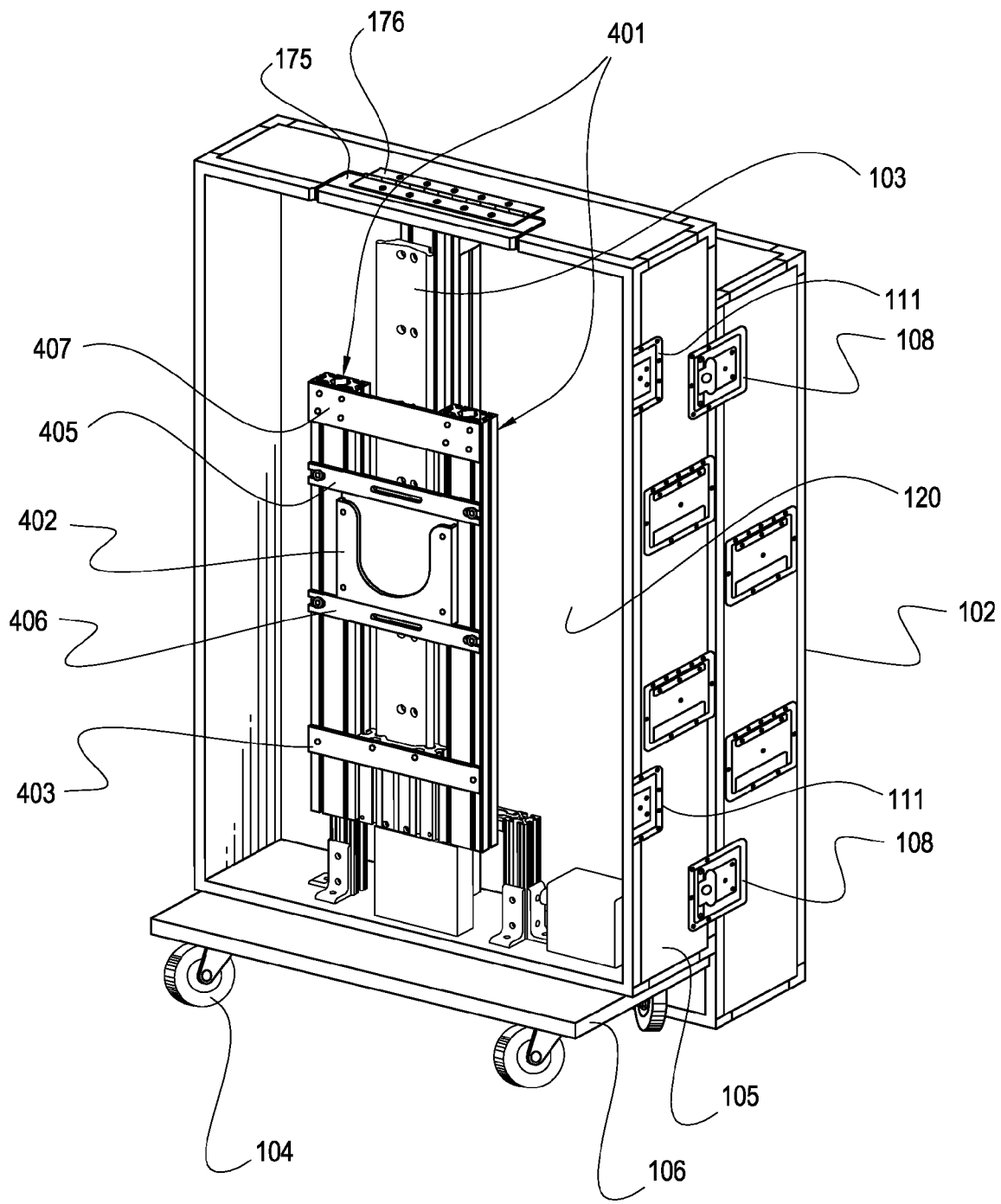
FIG. 5 depicts a perspective view of a preferred embodiment of the apparatus of the invention with the display removed for clarity, showing the vertical slide and rotating display mount in a lowered position.
Figure 6:
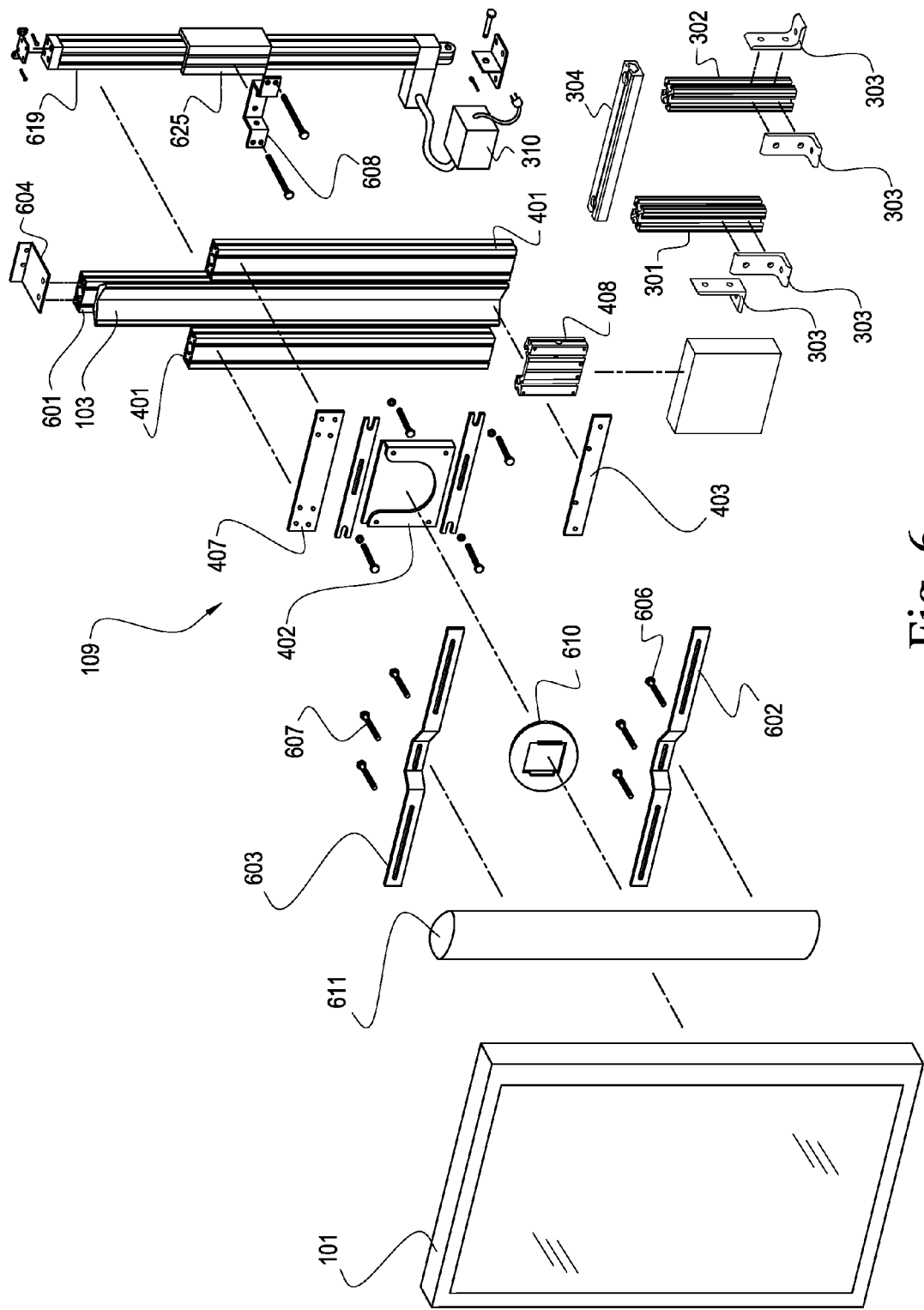
FIG. 6 depicts an exploded view of a preferred embodiment of the invention, further showing the relationship of the mounting and vertical slide elements.

Carriage assembly 109 comprises a cradle 402 comprising a turntable cutout 404 which may be, in a preferred embodiment, be semicircular, and which accepts cradle rotating plate 610 which rotates within cradle 402 thus providing stable and secure rotation of display 101, as is further depicted in FIGS. 4, 5, and 6, and is described further herein.

Figure 2:
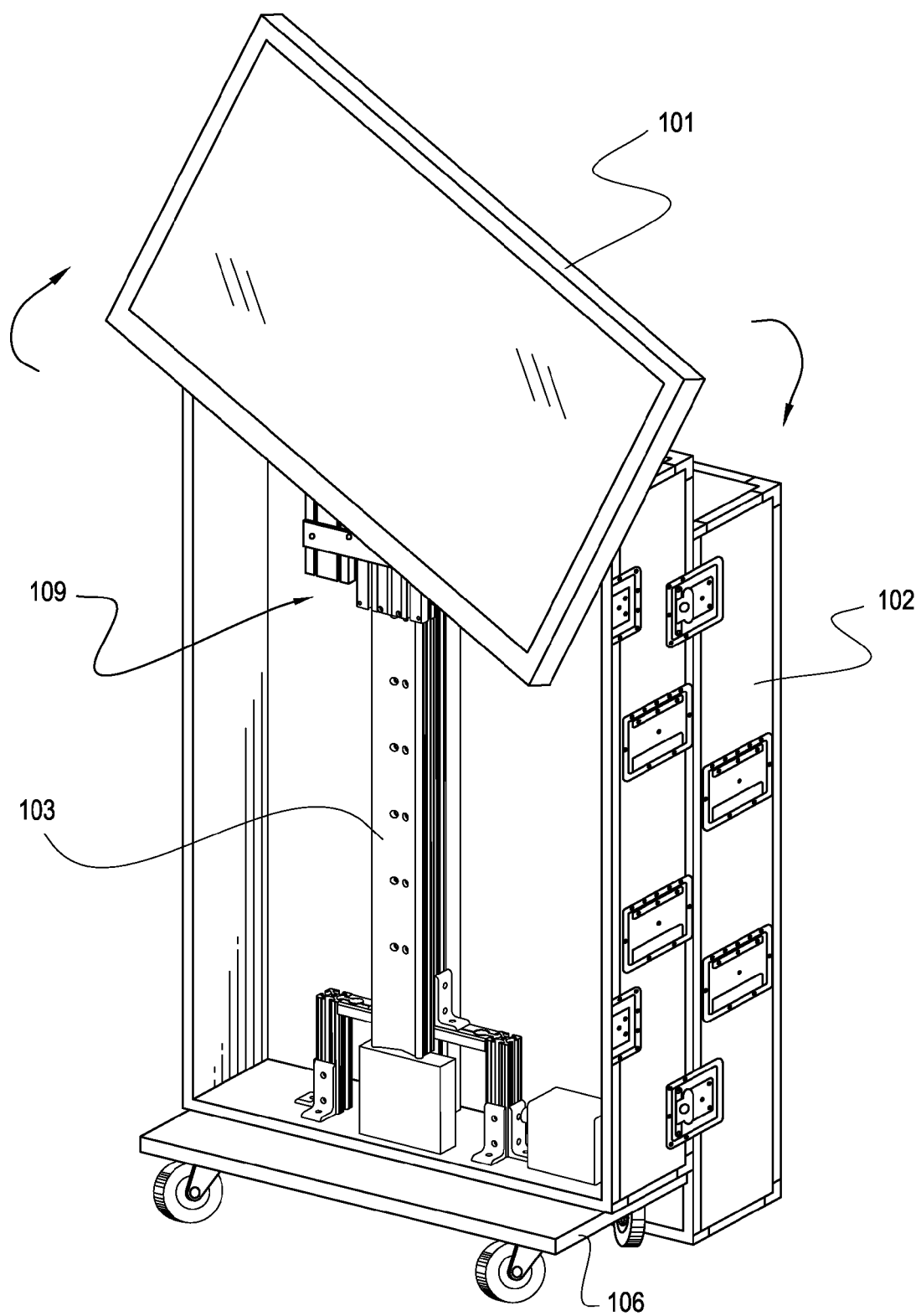
FIG. 2 depicts a perspective view of a preferred embodiment of the invention in which the case of the invention has been opened and a display is being rotated and vertically extended into position, where the display extends above the top of the case; this figure also further depicts the display rotating to support either a landscape or portrait orientation.

Referring now to FIG. 2, display 101 is shown rotating. In this figure, carriage assembly 109 has been moved to the upper limit of its travel on vertical slide rail 103. Display 101 is shown in a raised position in FIG. 2, but it is to be understood that display 101 may be moved into any position along vertical slide rail 103 as desired by the user.

As is shown in further detail in FIG. 6, cradle 402 accepts cradle rotating plate 610, which is adapted to rotate in cradle 402, allowing display 101 to rotate to any orientation desired, but which will usually be either landscape or portrait, as it will usually be desirable for display 101 to display text and graphics oriented to either a vertical or horizontal axis for ease of viewing. However, it should not be construed as a limitation of the invention that display 101 must be in either landscape or portrait orientation, as the apparatus of the invention is adapted to hold display 101 in any orientation.

Figure 3:
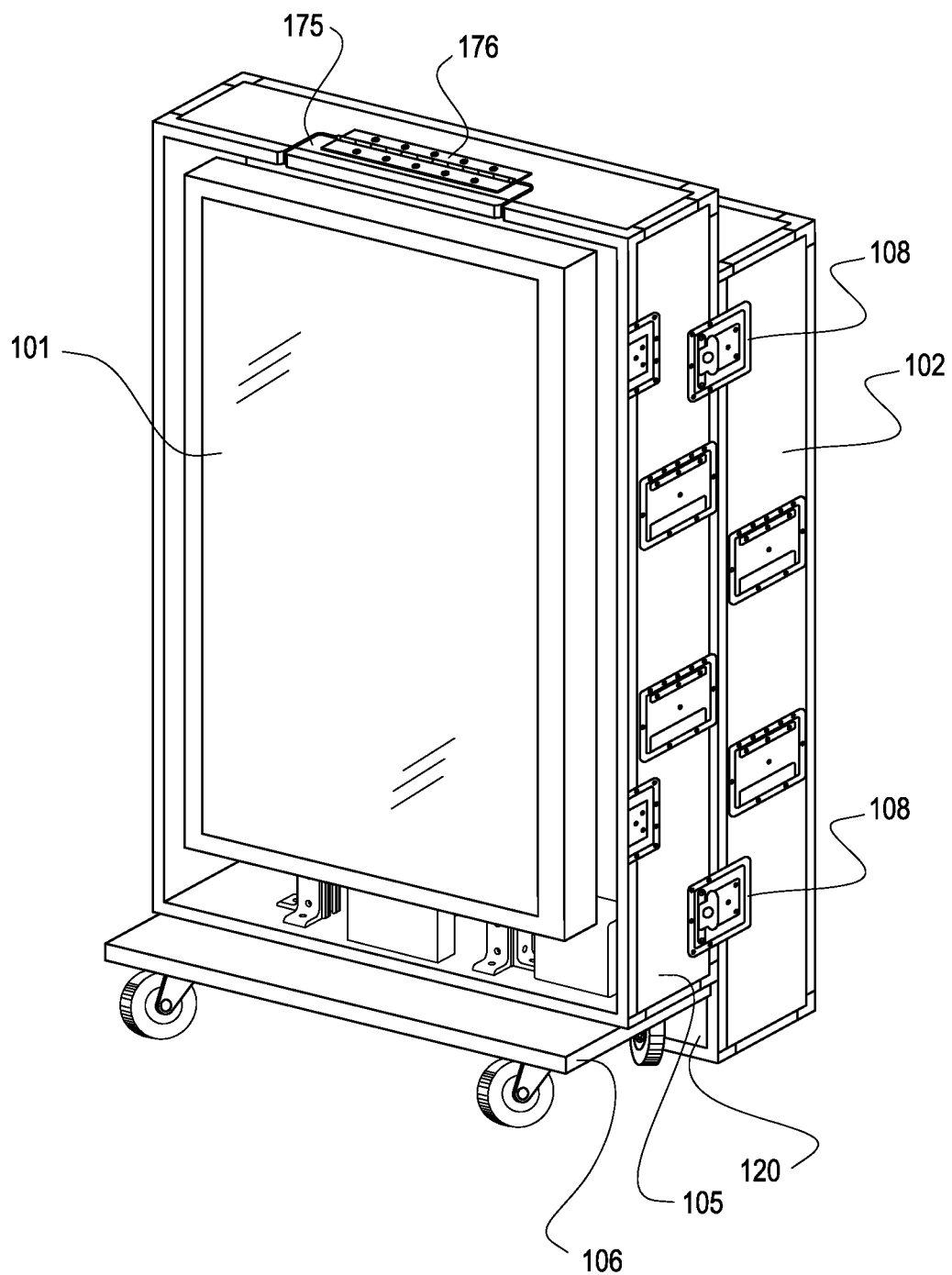
FIG. 3 depicts a perspective view of a preferred embodiment of the invention and depicting the display located in the case prior to extension and rotation.

Referring now to FIG. 3, transportation case halves 102 and 105 are connected through the use of case attaching latches 108 shown, such that the opening 120 of second transportation case half 102 is connected to the first transportation case half rear side. In FIG. 3 the carriage assembly and display have been lowered and secured in a portrait orientation for transportation or shipping. It should also be noted that the configuration of the apparatus shown in FIG. 3 may also be used for display purposes should the user so desire. It can easily be seen that second transportation case half 102 may be disengaged from first transportation case half rear side by removing by releasing latches 108 depicted as holding the two transportation case halves together, allowing transportation case half 102 to be removed and re-connected to first transportation case half 105 forming a complete shipping container as further depicted in FIG. 8. Support plate 106 may alternatively be left attached to the bottom surface of first transportation case half 105 to allow for ease of moving during shipping and storage, or may alternatively be removed and housed within the closed transportation case. A cutout in the top of first transportation case half 105 allows portions of the carriage assembly to extend through as shown in FIG. 3. Cutout cover 175 is adapted to substantially cover the cutout area as shown in FIG. 3. Cutout cover 175 may be fabricated from any suitable material, such as metal, or may be material left over from the forming of the cutout which may be accomplished, for instance, using a saw. Cutout cover 175 is attached to the top surface of the top of first transportation case half 105 by hinge 176, which allows cutout cover 175 to rotate backward and rest on the top of first transportation case half 105 when in an open position. Hinge 176 may attach to Cutout cover 175 and the top of first transportation case half 105 by threaded fasteners, rivets or other attachment means known in the art.

Figure 3A:
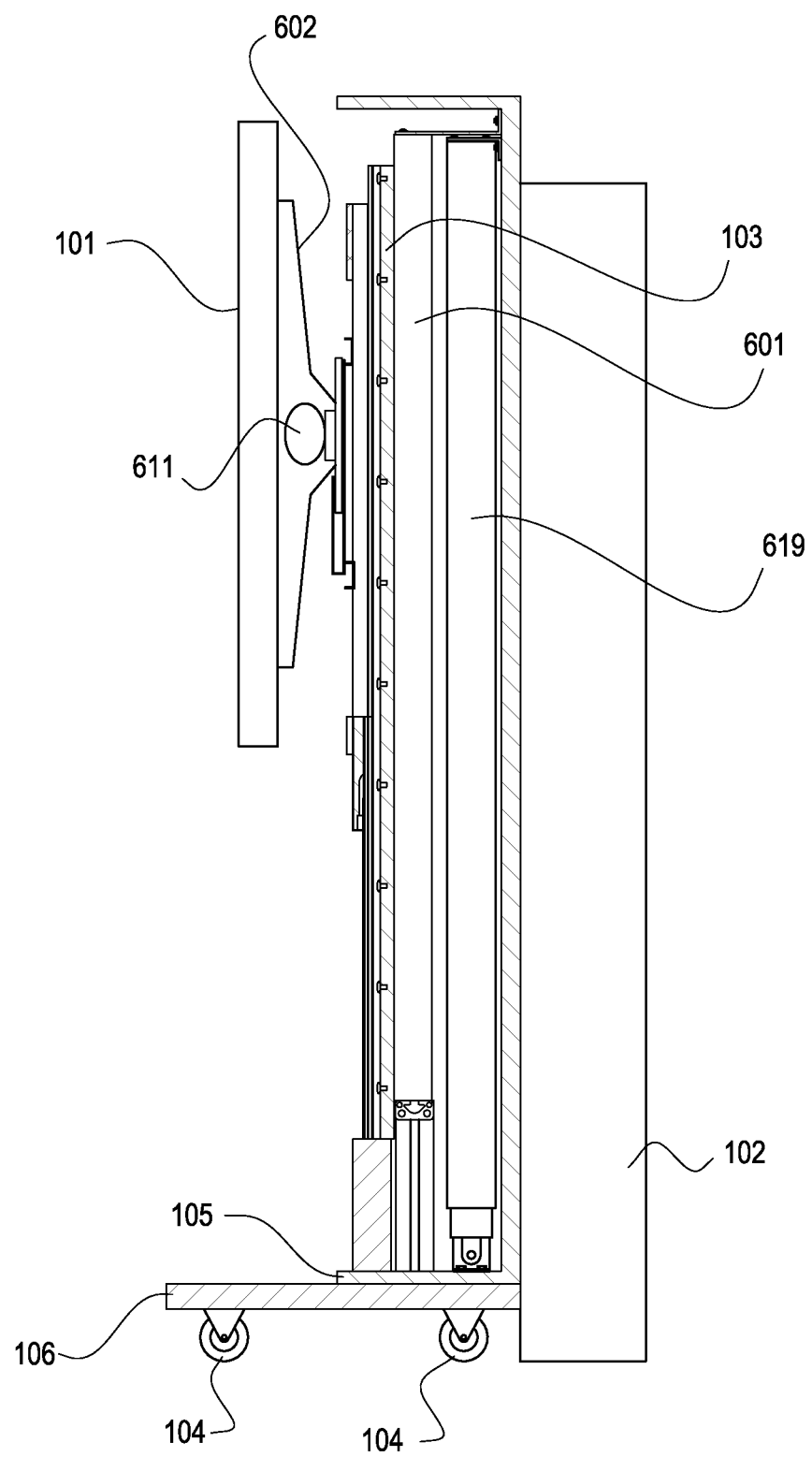
FIG. 3a is a cross section view of a preferred embodiment of the invention that depicts the mounting of the linear actuator of the invention to the first transportation case half.

Referring now to FIG. 3a, second transportation case half 102 is connected to the first transportation case half 105 rear side, and first transportation case half 105 rear side is shown in cross section. Linear actuator 619 may be attached on its lower end to the inside bottom surface of first transportation case half 105 by right angle bracket 180, which may be attached to the inside bottom surface of first transportation case half 105. Right angle bracket 180 may be attached to linear actuator 619 by any means known in the art for attachment of mechanical structures but is preferably attached by receiving pin 182 which passes through tang 181 formed on the bottom of linear actuator 619. Alternative means of attaching linear actuator 619 to the inside bottom surface of first transportation case half 105 may be any means known in the art. Alternatively, linear actuator 619 may be attached on its lower end to the inside back surface of first transportation case half 105 by a right angle bracket similar to that shown in FIG. 3a, only attached to the inside back surface of first transportation case half 105. Right angle bracket 180 is preferably attached to the inside bottom surface of first transportation case half 105 using threaded fasteners as is known in the art. Vertical slide rail may be attached to vertical slide support 601 using threaded fasteners as is shown in FIG. 3a.

Still referring to FIG. 3a, linear actuator 619 may be attached on its upper end to the inside back surface of first transportation case half 105 by right angle bracket 183, which may be attached to the inside back surface of first transportation case half 105. Right angle bracket 180 may be attached to linear actuator 619 by any means known in the art for attachment of mechanical structures but is preferably attached by threaded fasteners, and Right angle bracket 180 may be attached to the inside back surface of first transportation case half 105 also using threaded fasteners.

Referring now to FIG. 4, a perspective view of the apparatus of the invention is depicted with display 101 removed such that carriage assembly 109, vertical slide assembly 200 and other elements of the invention are more easily viewable. It will be appreciated that vertical slide assembly 200 and carriage assembly 109 are depicted as a particular assemblage of mechanical components in the figures but there are numerous alternate embodiments and equivalent structures thereof which fall within the scope of the claimed invention. A person of ordinary skill in the art will recognize that these alternate embodiments and equivalent structures are legal equivalents and are included within the scope of the invention.

Still referring to FIG. 4, carriage assembly 109 may comprise vertical elements 401, cradle 402 with receiving feature 404 which may be semicircular or any other shape that allows rotation of cradle rotating plate 610 in cradle 402, plates 403, 405, 406, and 407, and the mechanical hardware required to hold these elements together as depicted in FIG. 4, which may be, for instance threaded fasteners or equivalents. Such hardware, which is shown in more detail in FIG. 6, may be screws, washers and nuts, threaded fasteners, or may be any other hardware known in the art and suitable for the purpose of assembling the carriage. Alternatively, the carriage may be fabricated by means known in the art which does not allow easy disassembly, such as riveting, welding, casting and chemical bonding. For instance, carriage assembly 109 may be molded or cast forming a single piece, or, alternatively, selected elements of carriage assembly 109 may be molded or cast and assembled together to form carriage assembly 109. The attachments means and methods of manufacture utilized in carriage assembly 109 may therefore be any means known to a person of ordinary skill in the art. It can easily be seen that carriage assembly 109 is adapted to slide vertically up and down vertical slide element 103 of vertical slide assembly 200 to any position desired by the user by virtue of the sliding engagement of vertical slide car 616 with vertical slide rail 103. The vertical position of carriage assembly 200 may be any position desired by a user; carriage assembly 109, and thus display 101 if mounted, may be held in a desired vertical position by use of thumb screws, ball detent hardware, cam action hardware which may allow for quick release, rotatably connected elements such as screws adapted to be turned by hand, and the like. As an example of such locking elements shown in FIG. 4 is lock screw 409, which may comprise a lock screw knob and a male threaded rod which is threadingly engaged with matching female threads in sliding car 408. The male threaded rod portion of lock screw 409 is of sufficient length that it extends through vertical slide car 408 to contact vertical slide rail 103 with sufficient force to keep carriage assembly 109 from sliding down vertical slide rail 103, and thus may hold carriage assembly 200 and display 101, if attached, in any desired vertical position. Thus, when the user desires to use a display mounted to carriage assembly 109, they may cause the display to move up or down vertically until it is in a desired vertical position, whereupon the user may rotate lock screw 409 so as to cause it to extend through the receiving male threads in vertical slide car 616, contacting vertical slide rail 103 or any other attached structure, and locking the carriage into a desired vertical position. It is to be noted that the hardware utilized to hold the carriage in a vertical position may take a number of equivalent forms and structures.

Still referring to FIG. 4, vertical slide assembly 200 is now discussed in more detail. Vertical slide assembly 200 may comprise, in a preferred embodiment, vertical slide support 601, vertical slide rail 103 which are assembled together and may be attached to inner surfaces of first transportation case 105 in a number of equivalent structures. One such structure is now further described. First carriage assembly lower vertical support 301 and second vertical slide assembly lower vertical support 302 may be attached at their lower ends to the inside bottom surface of first transportation case 105 using right angle brackets 303 as shown in FIG. 4. Right angle brackets 303 may be attached to first vertical slide assembly lower vertical support 301 and second vertical slide assembly lower vertical support 302 and the inside bottom surface of first transportation case 105 using any means known in the art such as threaded fasteners, rivets or other means of attachment. Vertical slide assembly lower horizontal support 304 is attached to vertical slide assembly lower vertical support 301 and second vertical slide assembly lower vertical support 302 also using any mechanical attachment means known in the mechanical arts for making a right angle attachment such as right angle brackets utilizing threaded fasteners, welding, or any other means known in the art. Alternatively, first vertical slide assembly lower vertical support 301 and second vertical slide assembly lower vertical support 302 may be fabricated from an extrusion, for instance aluminum extrusion, that is shaped to accept sliding locking elements which are received by matching cutouts in vertical slide assembly lower horizontal support 304. Vertical slide support 601 may attach to two right angle brackets 303 which are in turn attached to vertical slide assembly lower horizontal support 304 as shown in FIG. 4, and in this manner vertical slide support 601 is held in place at its lower end. Right angle brackets 303 may attach to vertical slide support 601 using any mechanical attachment means known in the mechanical arts for making a right angle attachment such as right angle brackets utilizing threaded fasteners, welding, or any other means known in the art. Vertical slide 103 attaches to vertical slide support 601 by any means known in the mechanical arts, which may be, for example, a plurality of threaded fasteners. Not shown in FIG. 4, but shown in further detail in FIG. 6, vertical slide support 601 may, at its upper end, attach to the inner back surface of first transportation case half 105 by at least one vertical slide upper mounting bracket 604 that may either attach to the side or sides of vertical support 601 at its upper end, and also attach the inner back wall of transportation case half 105, or, alternatively, may attach to the top surface of vertical support 601 at its upper end, and also attach the inner back wall of transportation case half 105. Vertical slide upper mounting bracket 604 and any right angle bracket used to secure the upper end of vertical slide support 601 may attach to vertical slide support 601 and to the inner surfaces of first transportation case half 105 using any means known in the mechanical arts, which may be, for example, threaded fasteners, rivets, or other fastener as are known to one skilled in the mechanical arts.

Still referring to FIG. 4, carriage assembly 109 is now discussed in more detail. Sliding car 408 is slidingly engaged with vertical slide rail 103 by any means known in the art. In a preferred embodiment, traveling car 408 may comprise a cutout that is complementary to and adapted to accept the cross sectional shape of vertical slide rail 103 in a sliding engagement, forming a vertical slide assembly such that traveling car 408 may slide up and down vertical slide rail 103. Slide assemblies are well known in the mechanical arts and may take a number of forms and structures, all of which are included herein. For instance, slide assemblies exist which utilize linear bearings riding on tubes or bars; matching cross sections such as depicted in the drawings; and other sliding engagements. Still referring to FIG. 4, vertical carriage supports 401, first horizontal strap 407, second horizontal strap 405, third horizontal strap 406 and fourth horizontal strap 403 may be attached as shown in the figure. Vertical carriage supports 401, first horizontal strap 407, second horizontal strap 405, third horizontal strap 406 and fourth horizontal strap 403 may be attached to vertical supports 401 using, for example, male threaded fasteners that are received by matching female threads located in vertical carriage supports 401, which may be machined directly into vertical carriage supports 401 or may be a separate female-threaded device such as a nut or equivalent. Also attached to vertical carriage supports 401 is cradle 402 having turntable cutout 404, which is attached to vertical carriage supports 401 by any means known in the art but may be for example attached using male threaded fasteners that are received by matching female threads located in vertical carriage supports 401, which may be machined directly into vertical carriage supports 401 or may be a separate female-threaded device such as a nut or equivalent. Fourth horizontal strap 403 may be attached to sliding car 408 by any means known in the art but may be, for example, attached using male threaded fasteners that are received by matching female threads located in sliding car 408. With the elements of carriage assembly 109 thus assembled and held together, it can be seen that carriage assembly 109 may travel vertically up and down vertical slide rail 103 as desired by a user.

Referring now to FIG. 5, the carriage is shown lowered as it would be, for instance, for transportation. Display 101 is not shown for clarity sake. It can easily be seen that case half 102 may be disengaged from case half 105 by unlatching case attaching latches 108 which, prior to unlatching, hold the two transportation case halves together, allowing case half 102 to be removed and connected to case half 105 by bringing the transportation case half openings 120 together and engaging transportation case latches 111, making a complete shipping container as depicted further in FIG. 8. Support plate 106 and casters 104 may alternatively be left attached to transportation case half 105 to allow for ease of moving during shipping and storage, or they may alternatively be removed and housed within the closed case if desired. The space shown on either side of vertical slide 103 may be used to house, store and ship peripheral hardware and cables or other items as desired by the user.

Referring now to FIG. 6, a perspective exploded view of the transportable display apparatus is provided. A first horizontal display support 602 and a second horizontal display support 603 are attached to a rear mounting side of display 101, securing vertical display support 611 into place by sandwiching vertical display support 611 between first horizontal display support 602 and second horizontal display support 603 and the rear mounting side of the display. First horizontal display support 602 and second horizontal display support 603 may attach to the rear mounting surface of the display using a plurality of male threaded fasteners 607 and 606 or equivalents thereof. Cradle rotating plate 610 is attached to vertical display support 611 by weld tabs 609, which may be formed as part of cradle rotating plate 610, and which may be welded to vertical display mount 611, or, alternatively, may be attached to vertical display mount 611 by any other means of attachment known in the mechanical arts such as, for example, chemical bonding, brazing, or any other means suitable for attaching structural elements as is known. Cradle rotating plate 610 may nest inside cradle 402, and is adapted to rotatably engage with cradle 402. Cradle rotating plate 610 rests within cradle 402, and allows display 101 to be rotated to any desired position. Cradle rotating plate 610 is preferably configured to be circular shaped such that it is received by and rotates within cradle 402, but may be any shape that allows rotation of cradle rotating plate 610 within cradle 402. It can be seen that this cradle configuration allows for the rotation of display 101 in the assembled state in a safe and secure manner, as described elsewhere within this disclosure. Fastening hardware 607 and 606 may be comprised of screws, washers and nuts, or may be any other hardware known in the art and suitable for the purpose of assembling the apparatus. Alternatively, the apparatus may by assembled by means known in the art which does not allow easy disassembly, such as riveting, welding, and chemical bonding. The attachments means utilized to assemble the apparatus is not to be construed as a limitation of the apparatus; any means known in the art, whether allowing easy disassembly or not, may be utilized and falls within the scope and breadth of the invention.

Still referring to FIG. 6, linear actuator 619 is depicted. Linear actuator 619 is comprised of a vertical element and a traveling element 625 that translates vertically upon command from linear actuator controller 310, which is not shown in FIG. 6 but is shown in FIG. 4. Linear actuator controller 301 further comprises an electrical plug for connection to a power source, such as standard house AC power which may comprise 120 VAC. Linear actuators that operate from house power are known in the art. Linear actuator 619 is attached to carriage assembly 109 by linear actuator bracket 608. Threaded fasteners may be used to attach bracket 608 to linear actuator traveling element 625, and to attach linear actuator bracket 608 to the rear surfaces of vertical carriage supports 401, also preferably with threaded fasteners; however, any means of attaching linear actuator bracket to vertical carriage supports 401 and to linear actuator traveling element 625 is included within the scope of the art as equivalent structure. The base of linear actuator 619 is attached to the inner bottom surface of first transportation case half 105 such that when linear actuator 619 is commanded by linear actuator controller 310, traveling element 625 moves either up or down as commanded, causing carriage assembly 109, and display 101 if mounted, to also move up or down with traveling element 625. Linear actuator controller 310 is in electrical communication with linear actuator 619, and is also in connection with a power source which may be, for example, 120 VAC. Linear actuator 619 may be any linear actuator known in the art that fits within first transportation case 105, and may, alternatively, operate from 12 VDC, 24 VDC or other voltages.

Figure 7:
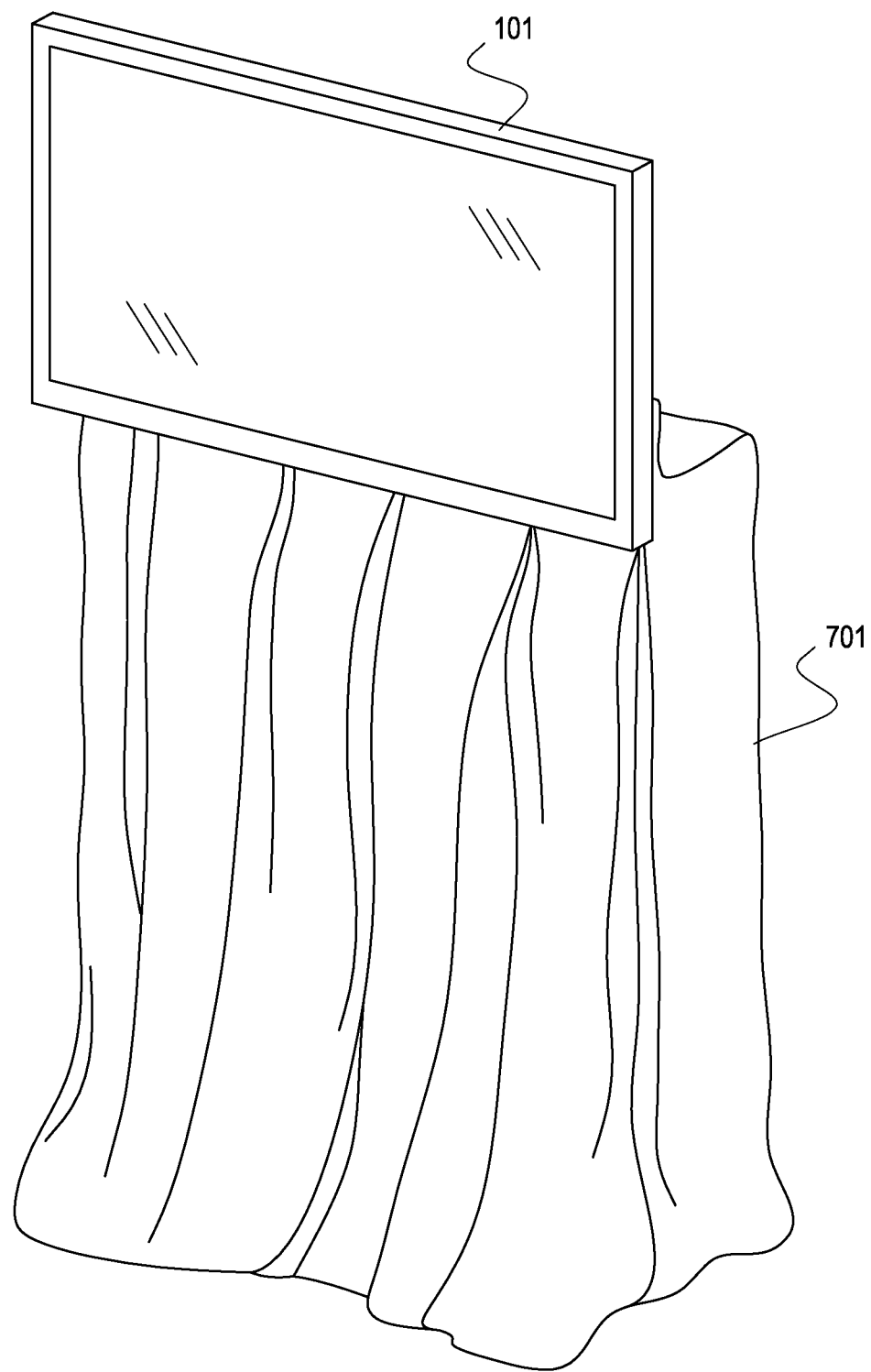
FIG. 7 depicts a preferred embodiment of the invention, as deployed for use, for example, at a conference, and further depicts an embodiment of the apparatus of the invention that includes a skirt for presenting a neat appearance.

Referring now to FIG. 7, a perspective view of the invention is shown with display 101 moved to the upper limit of its travel as it may be in a deployed condition. Skirt 701, which may be adapted to fit within the case for shipping, may cover substantially all or any part of the transportation case halves, support plate 106, casters 104, carriage assembly 109 and vertical slide assembly 200. It can thus be seen that the self-contained case and display apparatus are neatly presented to the viewer. Also, although display 101 is shown in the landscape position, it may be presented in any orientation, including portrait, which the user desires. Skirt 701 is shown as a draping fit over the transportation case halves, but it may also be a substantially tight fit, such as a custom fit, which is intended to provide a neater appearance than the loose fit depicted and may also provide smooth, roughly planar surfaces. The roughly planar surfaces thus formed may be utilized for branding and advertising, and may used to display graphics, words or symbols as desired by the user.

Referring now to FIG. 8, a perspective view of the apparatus is shown in which display 101 has been lowered and case halves 102 and 105 have been assembled together into the transportation position, forming a complete shipping container. It can be seen that the entire apparatus, including, alternatively, the display, comprise one unit for shipping, storage and handling.

Figure 9:
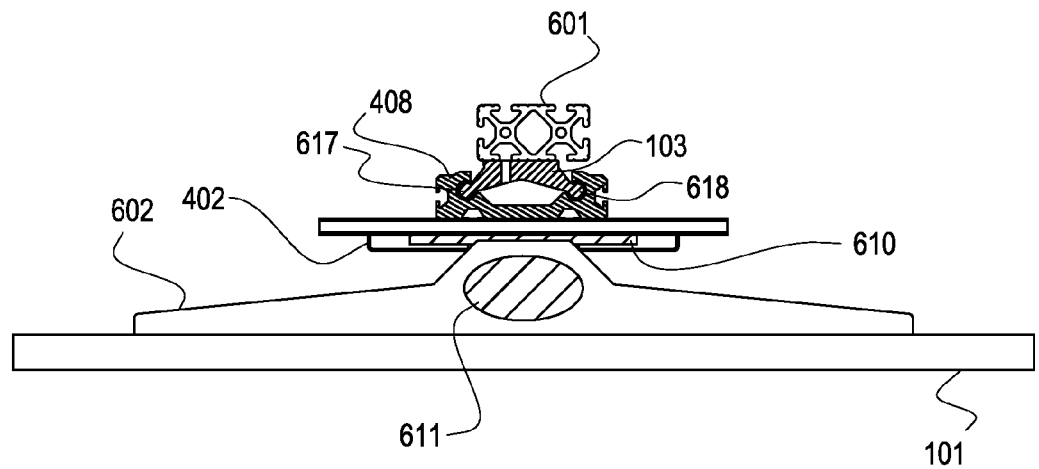
FIG. 9 depicts a cross sectional view of a vertical slide assembly of the invention, and showing also horizontal mounting members which are adapted to receive a display.

Referring now to FIG. 9, an top view cross section is shown in which vertical display support 611 is depicted attached to an alternate embodiment of first horizontal display support 602. In this alternate embodiment first horizontal display support 602 and second horizontal display support 603 may be fabricated of a sheet metal support of U-shaped cross section, instead of the flat sheet metal cross section as shown, for example, in FIG. 6. In this alternate embodiment, first horizontal display support 602 and second horizontal display support 603 may be welded, bonded, or connected by any means known in the mechanical arts for such a connection as between first horizontal display support 602 and second horizontal display support 603 and vertical display support 611. Cradle 402 is shown with cradle rotating plate 610 nested inside it, such that cradle rotating plate 610 may rotate freely within cradle 402. Cradle 402 is attached to sliding car 408, which is slidingly engaged with vertical slide rail 103. Sliding engagement interfaces 617 and 618 are shown as the point of sliding engagement between sliding car 408 and vertical slide rail 103. Sliding engagement interfaces 617 and 618 may further be lubricated with any lubricant or may further comprise any material used as a solid bearing surface to aid in reducing friction, such as Teflon® disposed between the sliding engagement interfaces 617 and 618 of sliding car 408 and vertical slide rail 103. Vertical slide rail 103 is attached to vertical slide support 601.

Vertical slide rail 103, support plate 106, first vertical slide assembly lower vertical support 301, second vertical slide assembly lower vertical support 302, right angle brackets 303, vertical slide assembly lower horizontal support 304, vertical carriage supports 401, cradle 402, fourth horizontal strap 403, second horizontal strap 405, third horizontal strap 406, first horizontal strap 407, sliding car 408, male threads of lock screw 409, vertical slide support 601, first horizontal display support 602, second horizontal display support 603, vertical slide upper mounting bracket 604, fasteners 606, fasteners 607, linear actuator bracket 608, cradle rotating plate 610, and vertical display support 611 are, in a preferred embodiment, fabricated from metal, and further may be fabricated from aluminum or aluminum allows in order to reduce weight. Alternatively, composite and plastic materials may be used. Included within the scope of the invention are all materials used in the mechanical arts for fabricating mechanical structures.

Figure 9A:
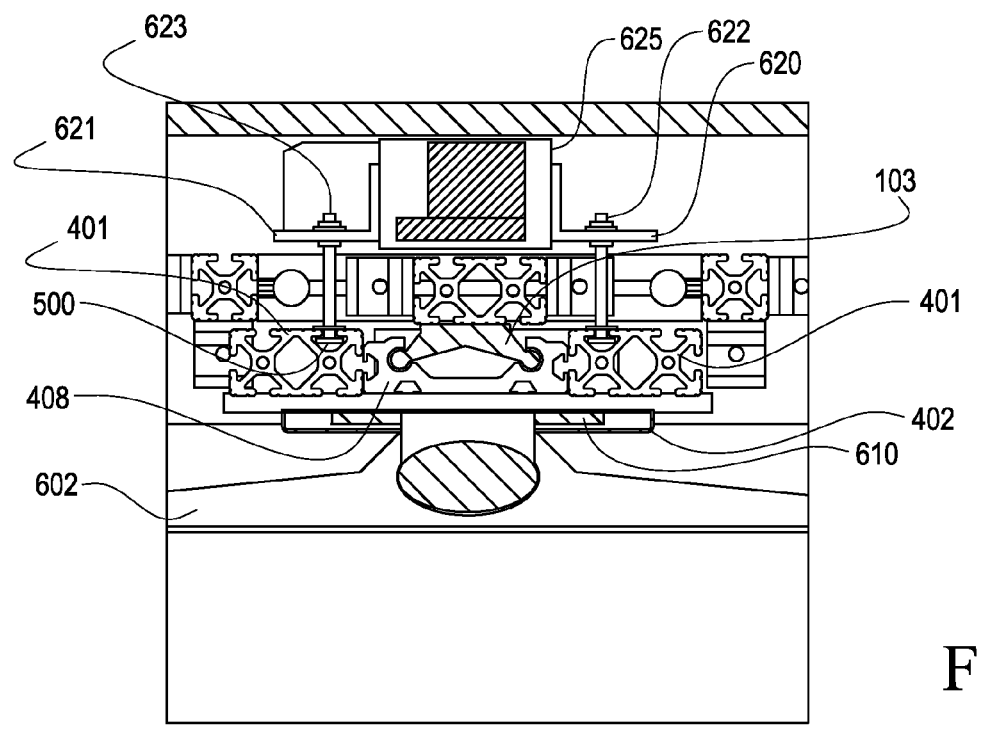
FIG. 9a depicts a cross sectional view of an alternate embodiment of the invention, showing a cross section of a vertical slide assembly of the invention, and showing also horizontal mounting members which are adapted to receive a display.

Referring now to FIG. 9a a cross sectional view of the invention is shown. Sliding car 408 is slidingly engaged with vertical slide rail 103. Linear actuator traveling element 625 is depicted with an alternate means of attachment to vertical carriage supports from that depicted in FIG. 6. In FIG. 9a, linear actuator traveling element 625 is attached to vertical carriage supports 401 by angle brackets 620 and 621. Angle brackets 620 and 621 may be attached to linear actuator traveling element 625 by threaded fasteners or any other equivalent means. Angle brackets 620 and 621 may be attached to vertical carriage supports 401 using male threaded components 622 and 623 threaded into female threaded components 500. Vertical carriage supports 401 are, in a preferred embodiment, extrusions as are depicted in cross section in FIG. 9a. In this manner, which is one of many structural equivalents that are within the scope of the claims, linear actuator traveling element 625 is attached to vertical carriage supports 401 such that when linear actuator traveling element 625 is commanded to move up and down linear actuator 619, carriage assembly 109 will move with it.

Figure 10:
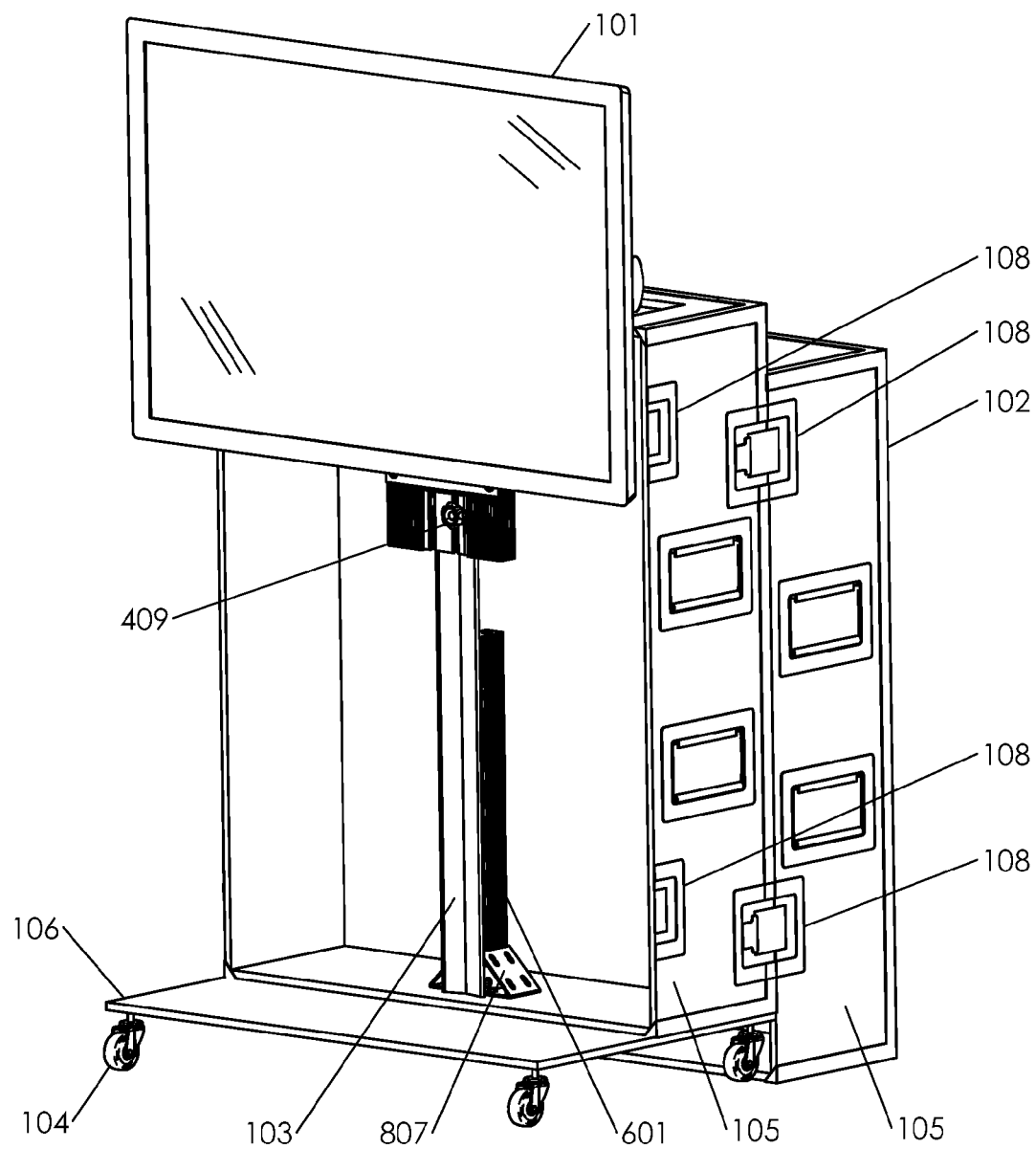
FIG. 10 depicts a perspective view of an alternate embodiment of the invention.

Referring now to FIGS. 10-24, an alternate embodiment of the transportable deployable display apparatus of the invention is shown and taught. First and second transportation case halves are shown in FIG. 10 assembled in the display position. In this alternate embodiment, vertical slide support 601 is attached to the inner bottom surface of first transportation case 105 by right angle bracket 807, or, preferably a plurality of right angle brackets 807. As shown in FIG. 10, there may be two right angle brackets attaching vertical slide support 601 to the inner bottom surface of first transportation case 105, one on either side of vertical slide support 601. Right angle brackets 807 may be attached to both vertical slide support 601 and the inner bottom surface of first transportation case 105 by one more threaded fasteners. Vertical slide rail 103 is attached to vertical slide support 601 by threaded fasteners or other fastening means as is known in the mechanical arts. Also depicted in FIG. 10 is lock screw 409 which may comprise a lock screw knob and a male threaded rod which is threadingly engaged with matching female threads in vertical slide car 616. The male threaded rod portion of lock screw 409 is of sufficient length that it extends through vertical slide car 616 to contact vertical slide rail 103 with sufficient force to keep carriage assembly 109 from sliding down vertical slide rail 103.

Figure 10A:
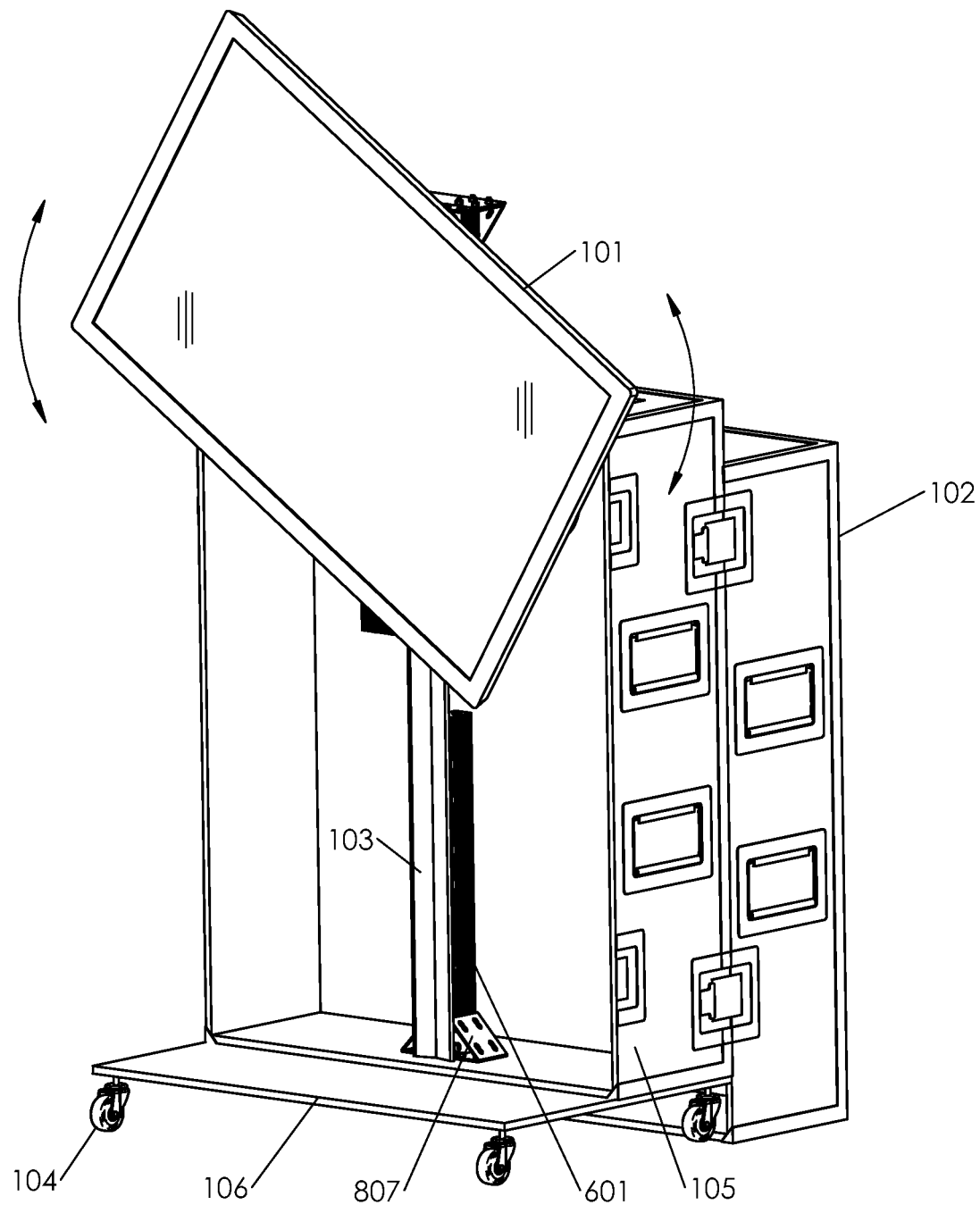

FIG. 10a is a perspective view of an alternate embodiment of the invention depicting display 101 rotating, and also again depicting vertical slide support 601 is attached to the inner bottom surface of first transportation case 105 by right angle bracket 807, or, preferably a plurality of right angle brackets 807.

Figure 11:
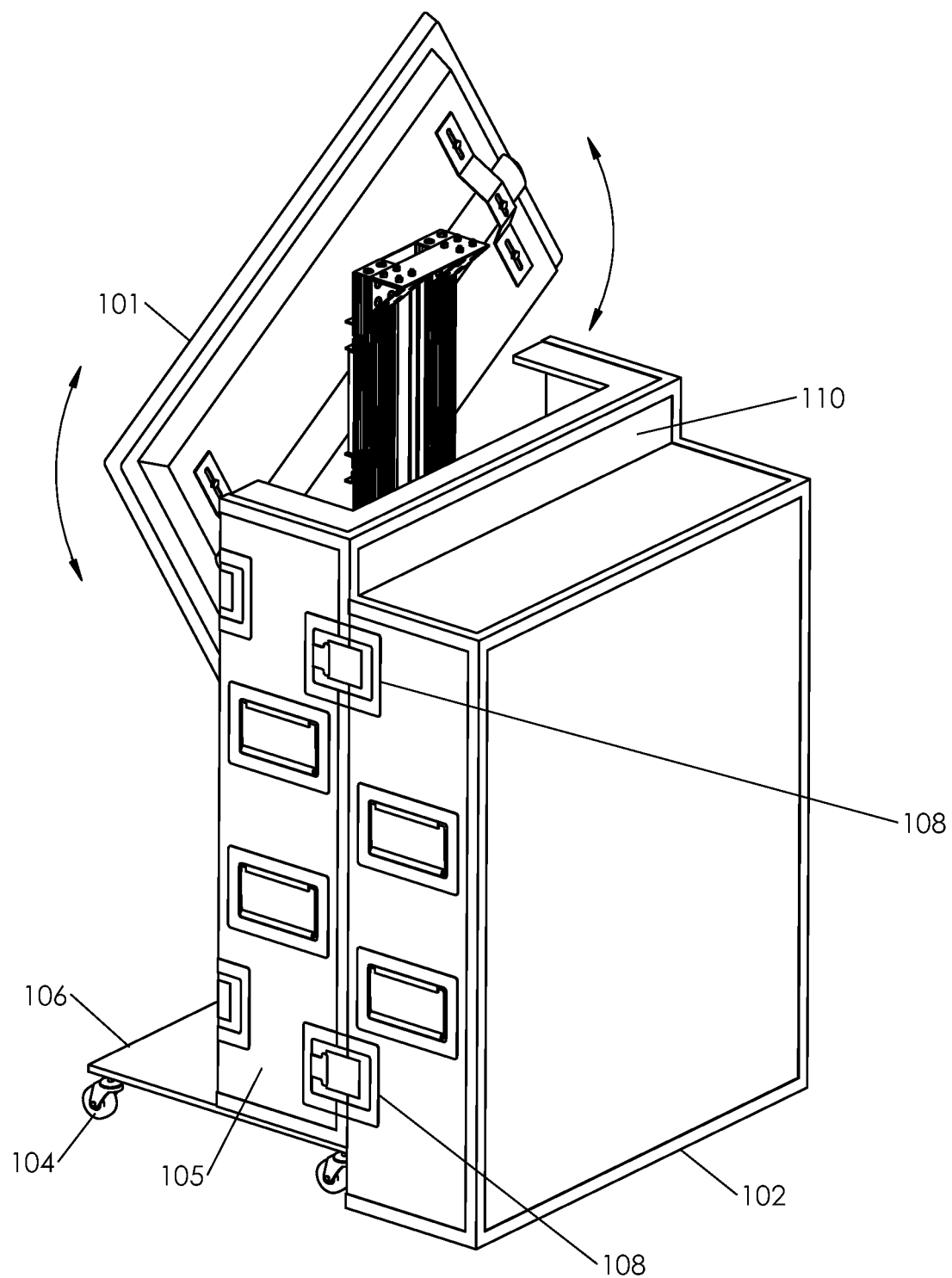
FIG. 11 depicts a perspective rear view of an alternate embodiment of the invention, showing the display in rotation.

Referring next to FIG. 11, a rear perspective view of an alternate embodiment of the transportable deployable display apparatus of the invention is shown, which depicts display 101 rotating as desired by a user.

Figure 12:
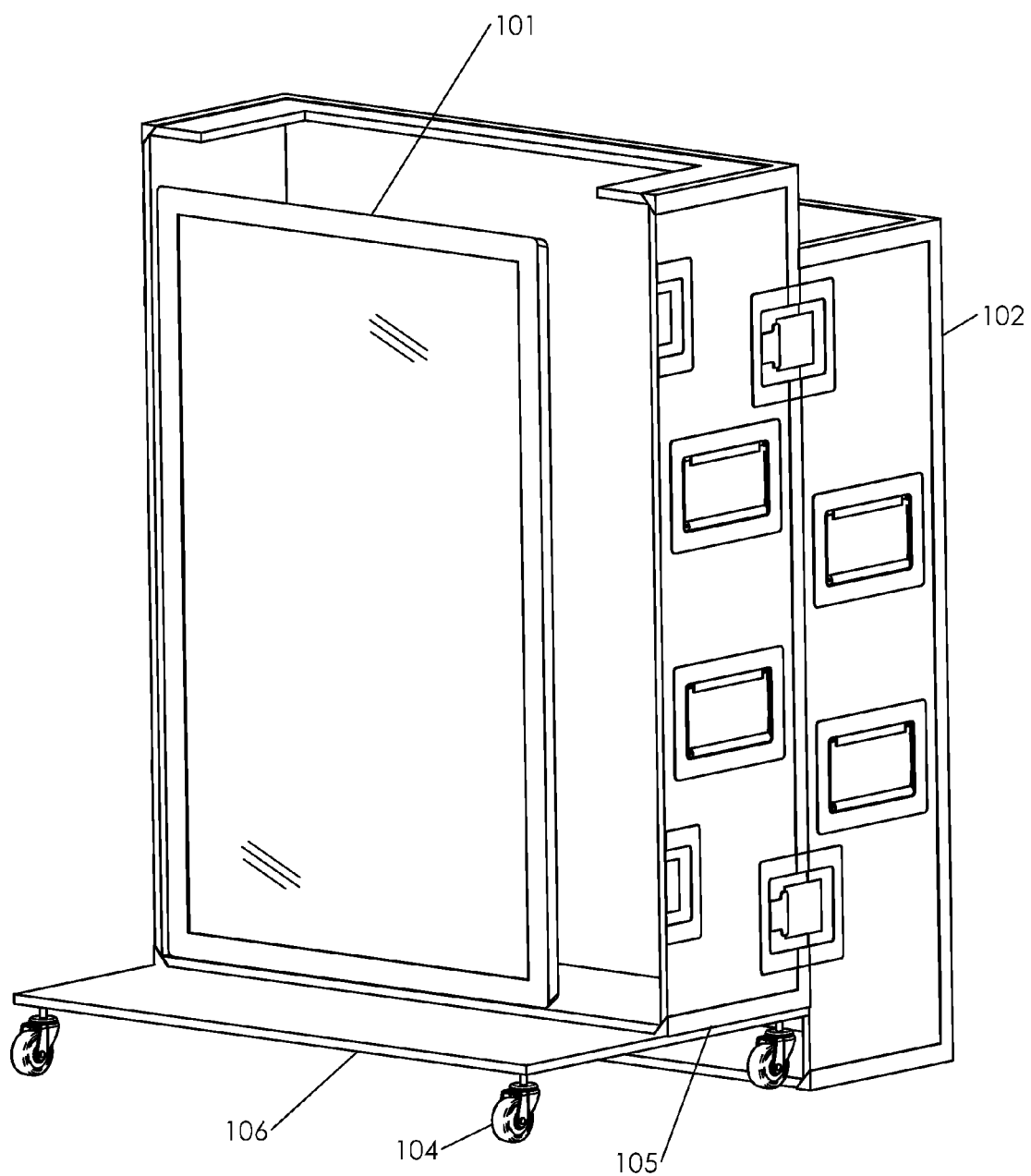
FIG. 12 depicts a perspective view of an alternate embodiment of the invention and depicting the display located in the case prior to extension and rotation

Referring next to FIG. 12, a perspective view of an alternate embodiment of the transportable deployable display apparatus is shown, in which the display has been lowered to its lowest position as it would be, for instance, if it were desired to attach case 102 to 105 in order to transport the invention.

Figure 13:
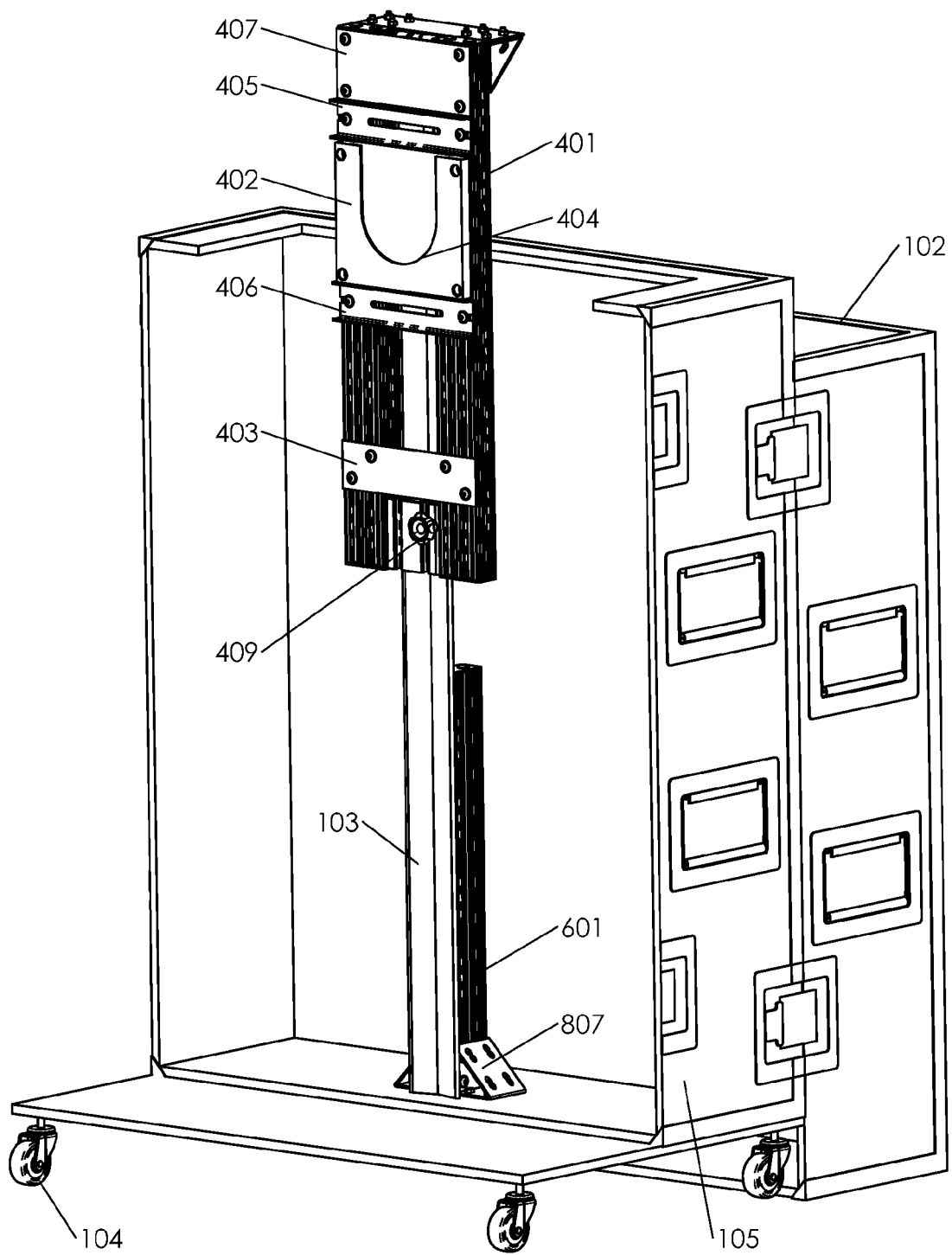
FIG. 13 depicts a perspective view of an alternate embodiment of the apparatus of the invention with the display removed for clarity, depicting the vertical slide and track elements with the slide in a raised position.

Referring next to FIG. 13, a perspective view of an alternate embodiment of the transportable deployable display apparatus is shown, in which carriage assembly 109 is depicted at the upper limits of its travel. In this figure display 101 has been removed for clarity. First horizontal strap 407, second horizontal strap 405, third horizontal strap 406 and fourth horizontal strap 403 are depicted attached to vertical carriage supports 401 by threaded fasteners. First horizontal strap 407, second horizontal strap 405, third horizontal strap 406 and fourth horizontal strap 403 may also attach to vertical carriage supports 401 by any other equivalent structure or any other method known in the art, as described above. Also depicted is lock screw 409 threaded into sliding car 408.

Figure 14:
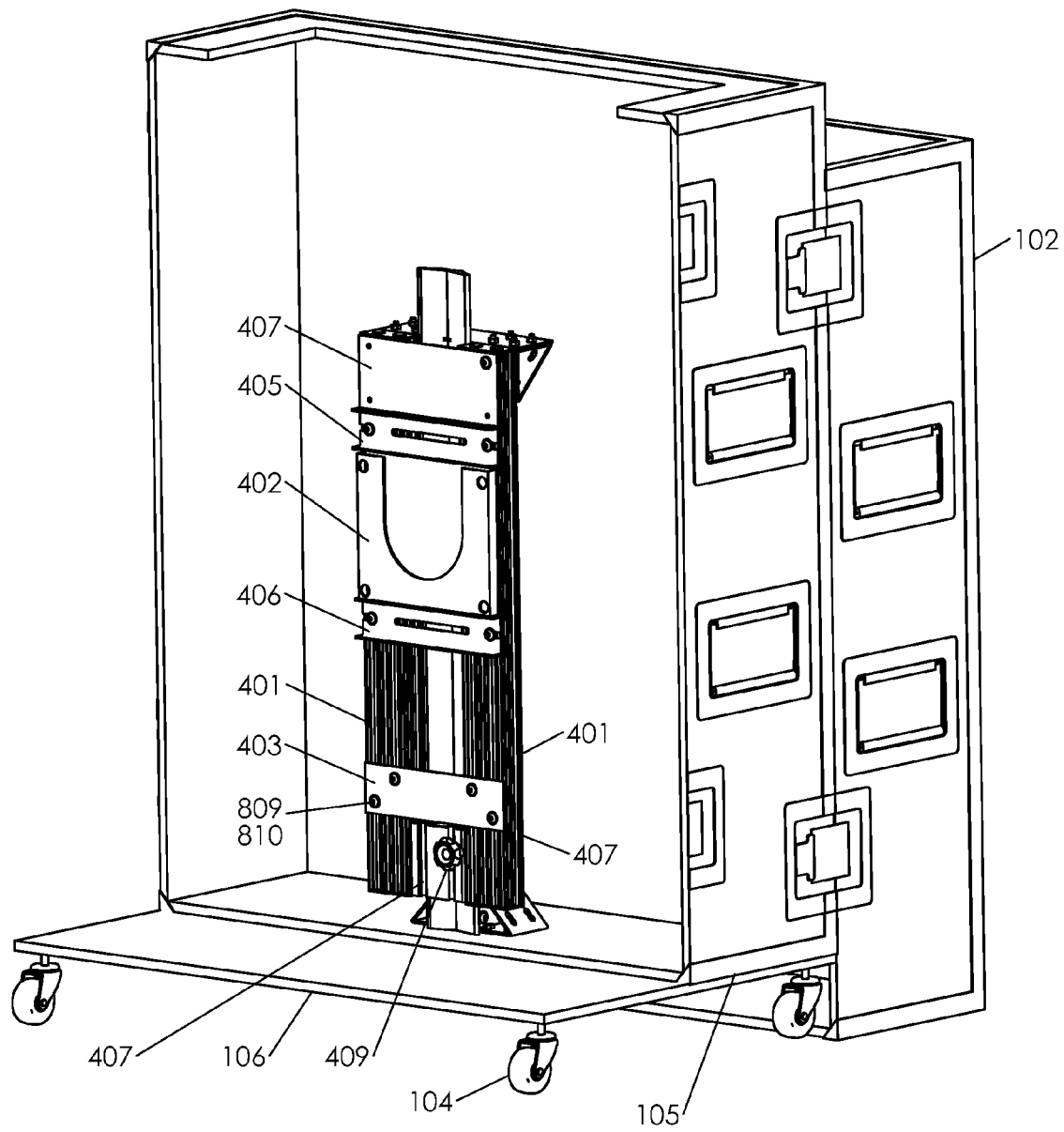
FIG. 14 depicts a perspective view of an alternate embodiment of the apparatus of the invention with the display removed for clarity, showing the vertical slide and rotating display mount in a lowered position.

Referring next to FIG. 14, a perspective view of an alternate embodiment of the transportable deployable display apparatus is shown, in which carriage assembly 109 is depicted at the lower limits of its travel. In this figure display 101 has been removed for clarity. First horizontal strap 407, second horizontal strap 405, third horizontal strap 406 and fourth horizontal strap 403 are depicted attached to vertical carriage supports 401 by threaded fasteners 809. First horizontal strap 407, second horizontal strap 405, third horizontal strap 406 and fourth horizontal strap 403 may also attach to vertical carriage supports 401 by any other equivalent structure or any other method known in the art, as described above. Also depicted is lock screw 409 threaded into sliding car 408.

Figure 15:
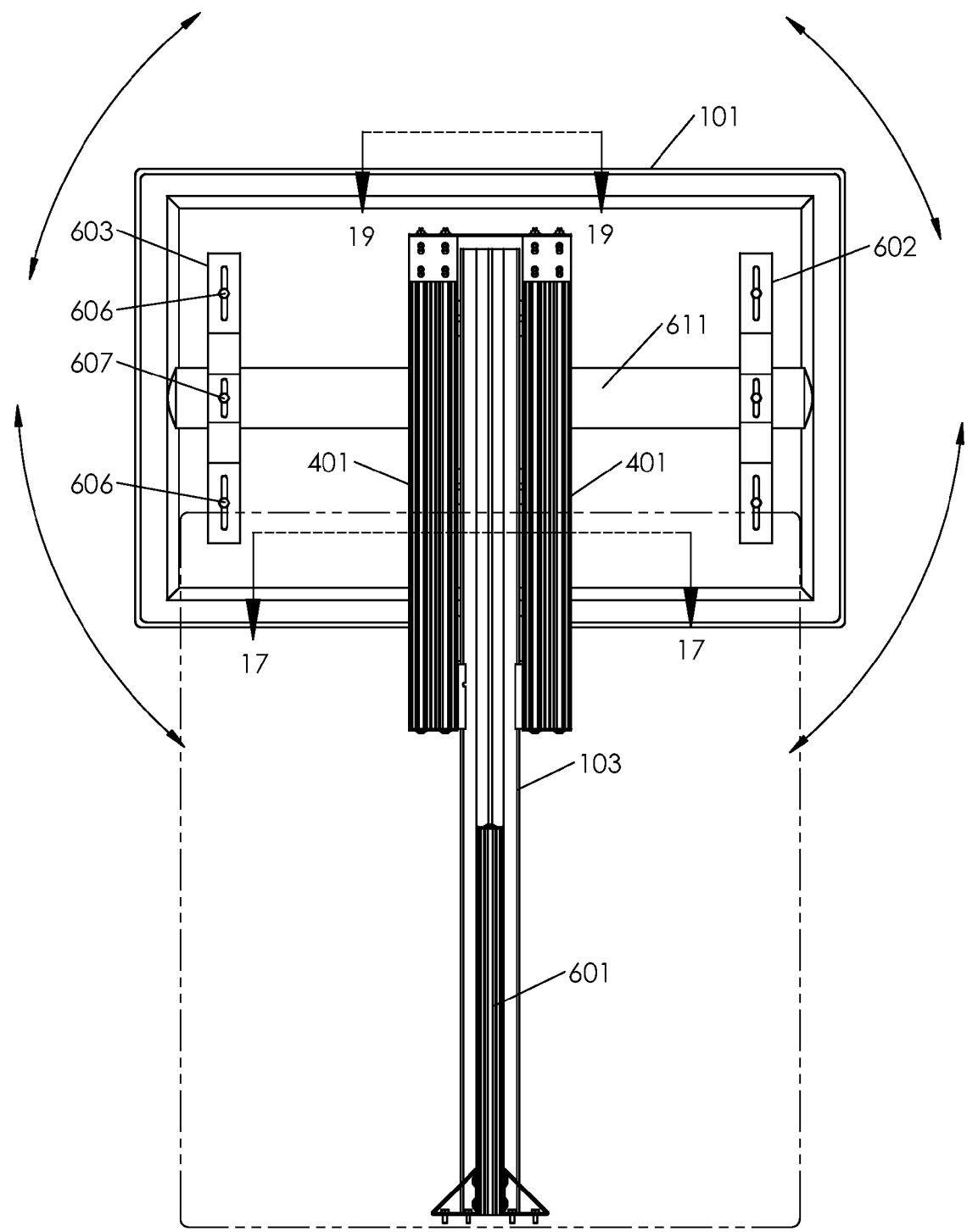
FIG. 15 depicts a rear view of an alternate embodiment of the apparatus of the invention with the transportation case halves removed for clarity.

Referring next to FIG. 15, a rear view of an alternate embodiment of the invention is shown, with the transportation cases not shown for clarity. First horizontal mounting strap 602 and second horizontal mounting strap 603 are attached to the rear of display 101 by threaded fasteners 606, and are also attached to vertical display support 611 by threaded fasteners 607.

Figure 16:
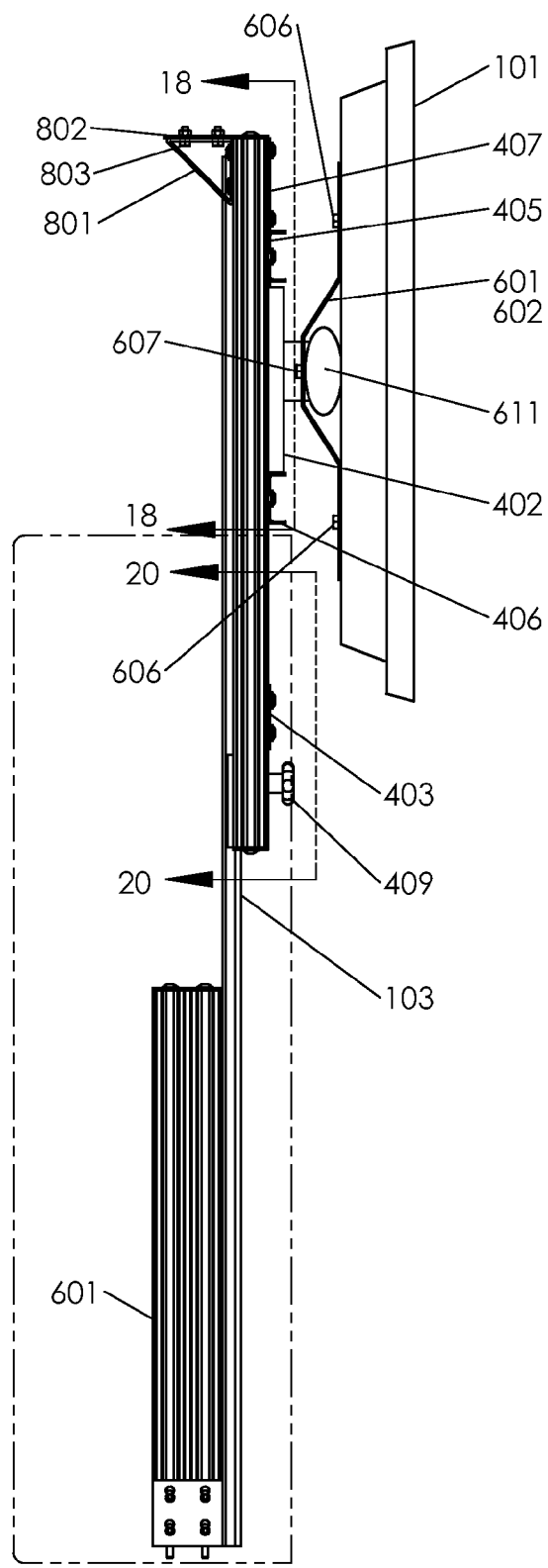
FIG. 16 depicts a side view of an alternate embodiment of the apparatus of the invention with the transportation case halves removed for clarity.

Referring next to FIG. 16, a side view of an alternate embodiment of the invention is shown, with the transportation cases not shown for clarity. Carriage right angle brackets 801 are attached to vertical carriage supports 401 as shown using, preferably, threaded fasteners; and carriage support plate 802 is attached to carriage right angle brackets 801 using, preferably, threaded fasteners. Alternate means of fastening such as rivets or other fasteners, or unitary construction such as welding, molding or casting or their equivalents may also be used as attachment means.

Figure 17:
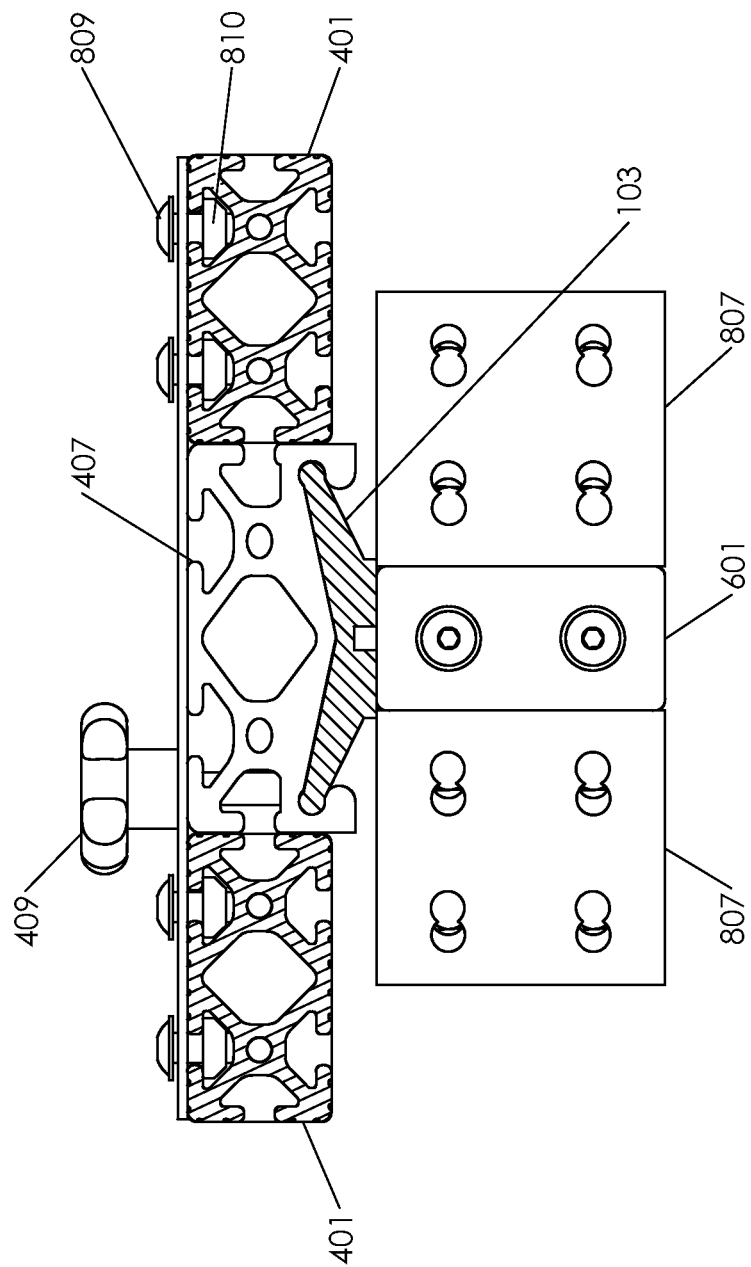
FIG. 17 depicts a cross sectional view of vertical slide of an alternate embodiment of the invention.

FIG. 17 depicts a cross sectional view of vertical slide support 601 attached to vertical slide rail 103, and an alternate embodiment of sliding car 408 slidingly engaged with vertical slide rail 103. Vertical carriage supports 401 are attached via threaded fasteners 809 to first horizontal strap 407. Lock screw 409 threads into female threads in sliding car 408 and is used to prevent movement of sliding car 408 when tightened so as to extend and make contact with vertical rail 103. Also shown are right angle brackets which mount vertical slide support to the inner bottom surface of first transportation case half 105.

Figure 18:
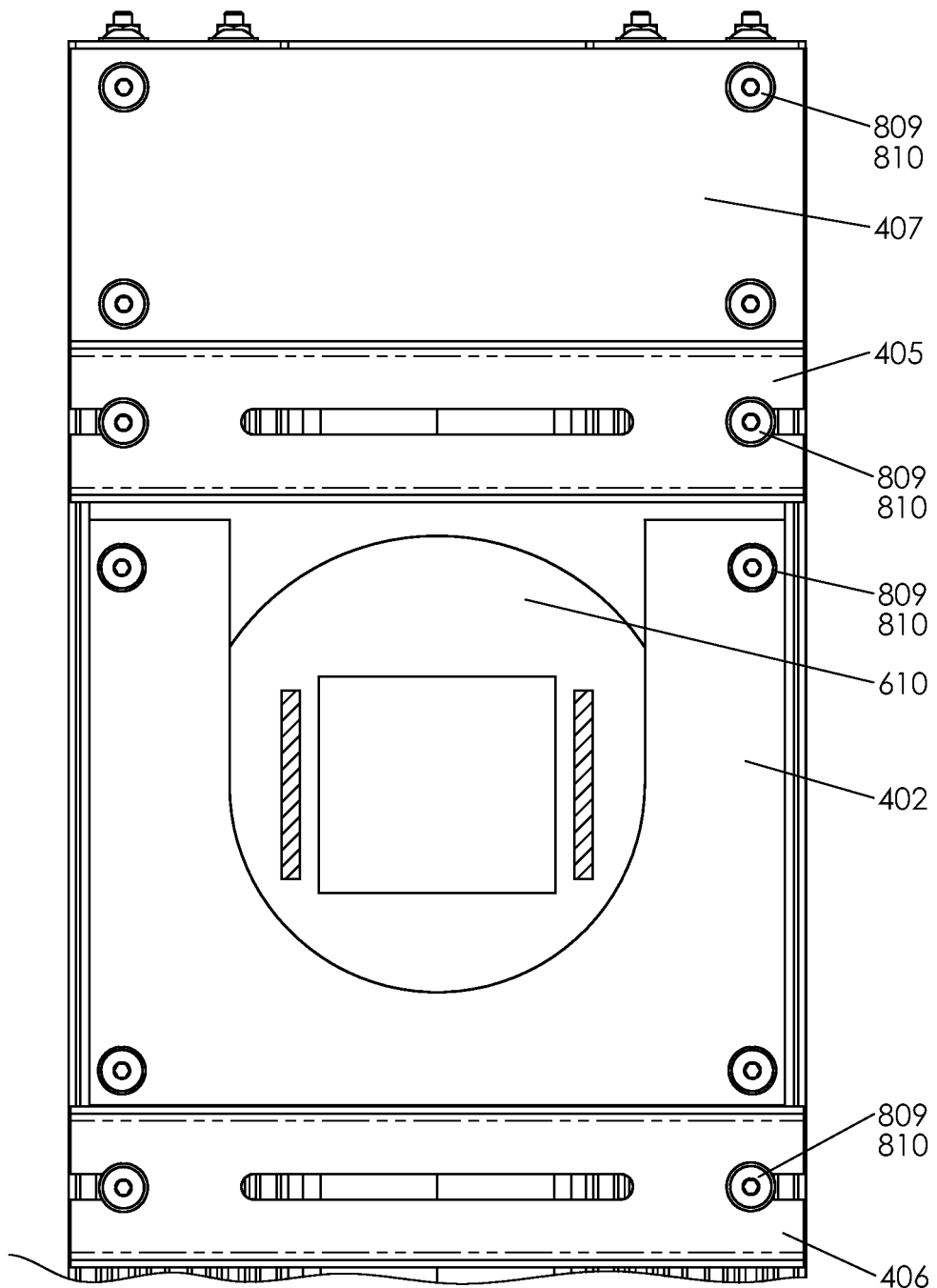
FIG. 18 is a cross sectional view depicting the rotational elements of an alternate embodiment of the invention.

FIG. 18 is a cross sectional view depicting an embodiment of cradle rotating plate 610 as nested within cradle 402, providing rotating means allowing display 101 to rotate as desired.

Figure 19:
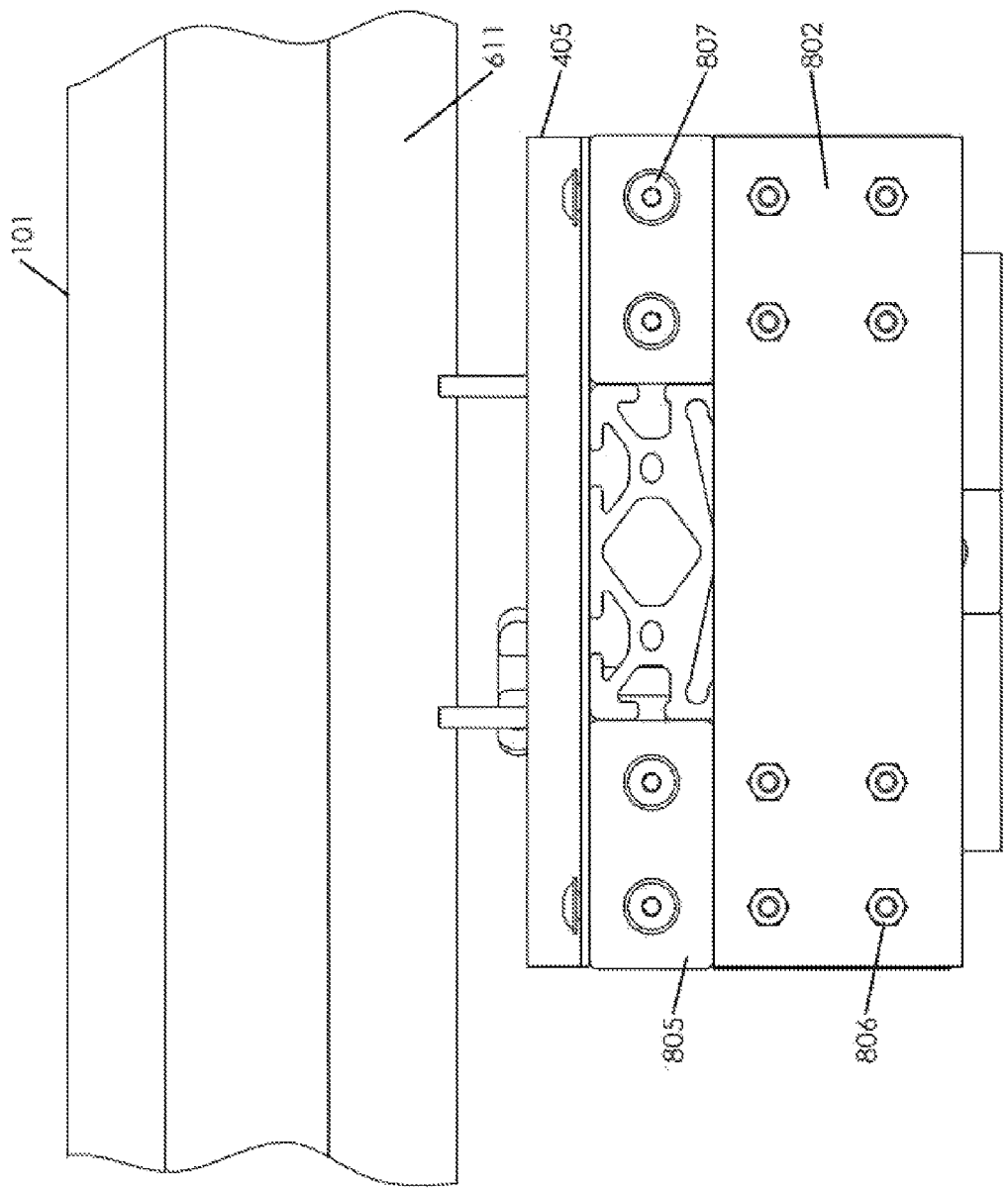
FIG. 19 is a top view of the vertical slide elements of an alternate embodiment of the apparatus of the invention.

FIG. 19 is a top view showing that a plurality of threaded fasteners 806 attaches carriage support plate 802 to right angle brackets 801, and showing cover plates 805 attached to the top surface of vertical carriage supports 401 by threaded fasteners 807.

Figure 20:
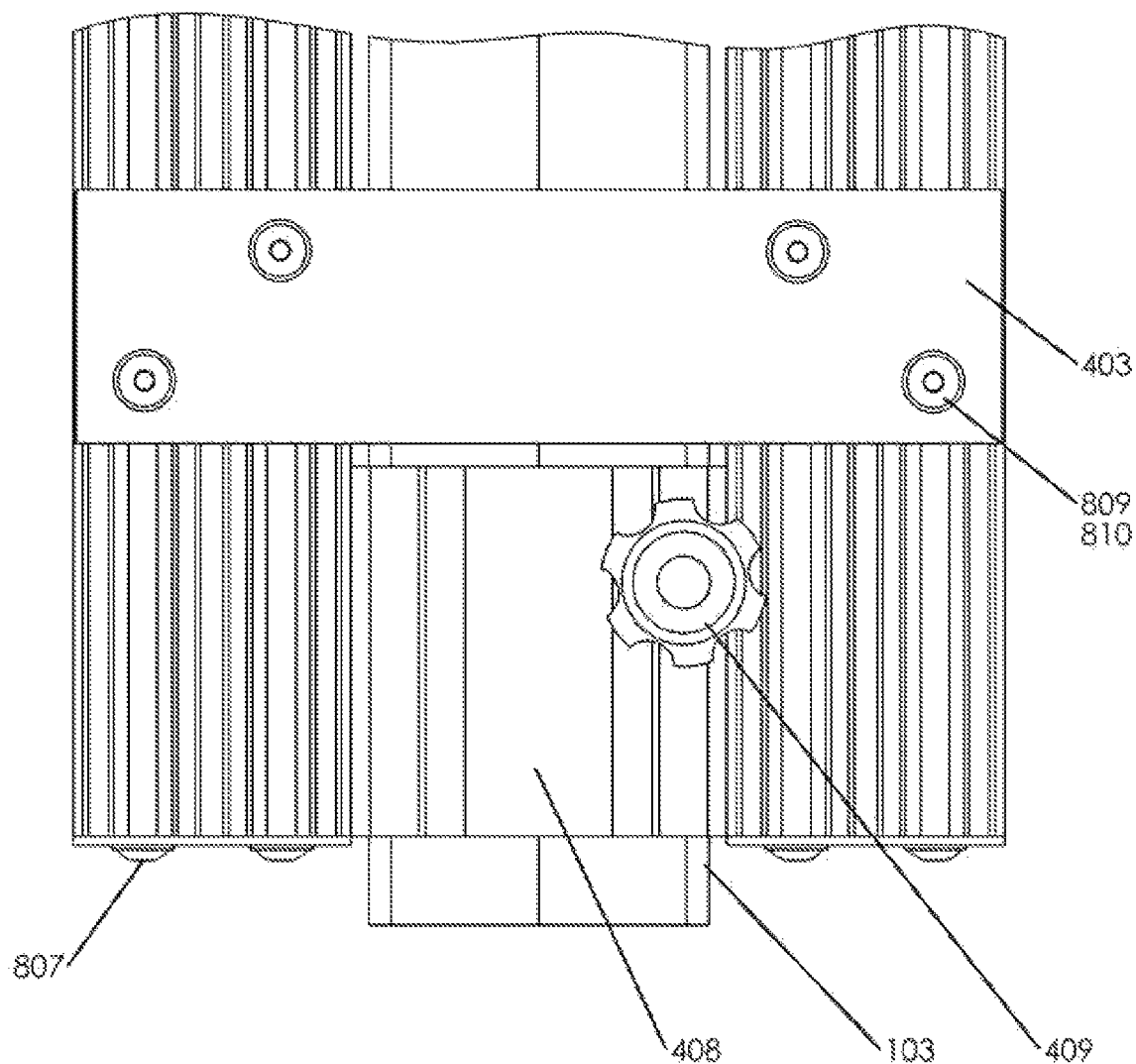
FIG. 20 is a detail view of the sliding car and lock screw of an alternate embodiment of the apparatus of the invention.
Figure 21:
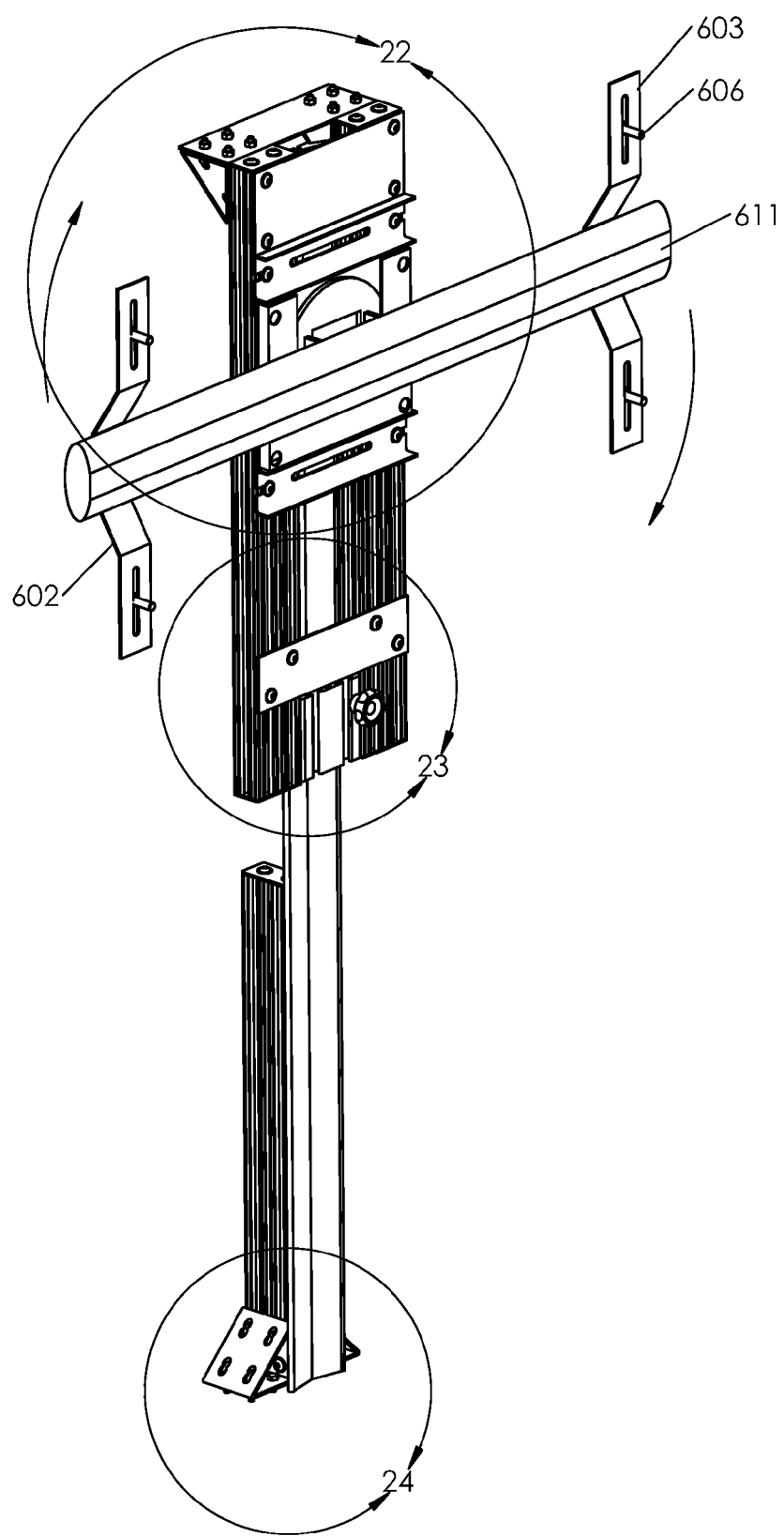
FIG. 21 is a perspective view of the vertical slide and carriage assemblies of an alternate embodiment of the apparatus of the invention, with the display not shown for clarity.

Referring now to FIG. 20, sliding car 408 is adapted to receive the male threads of lock screw 409. Fourth horizontal strap 403 may be attached to vertical carriage supports 401 by threaded fasteners 809 which may also include washer 810.

Figure 22:
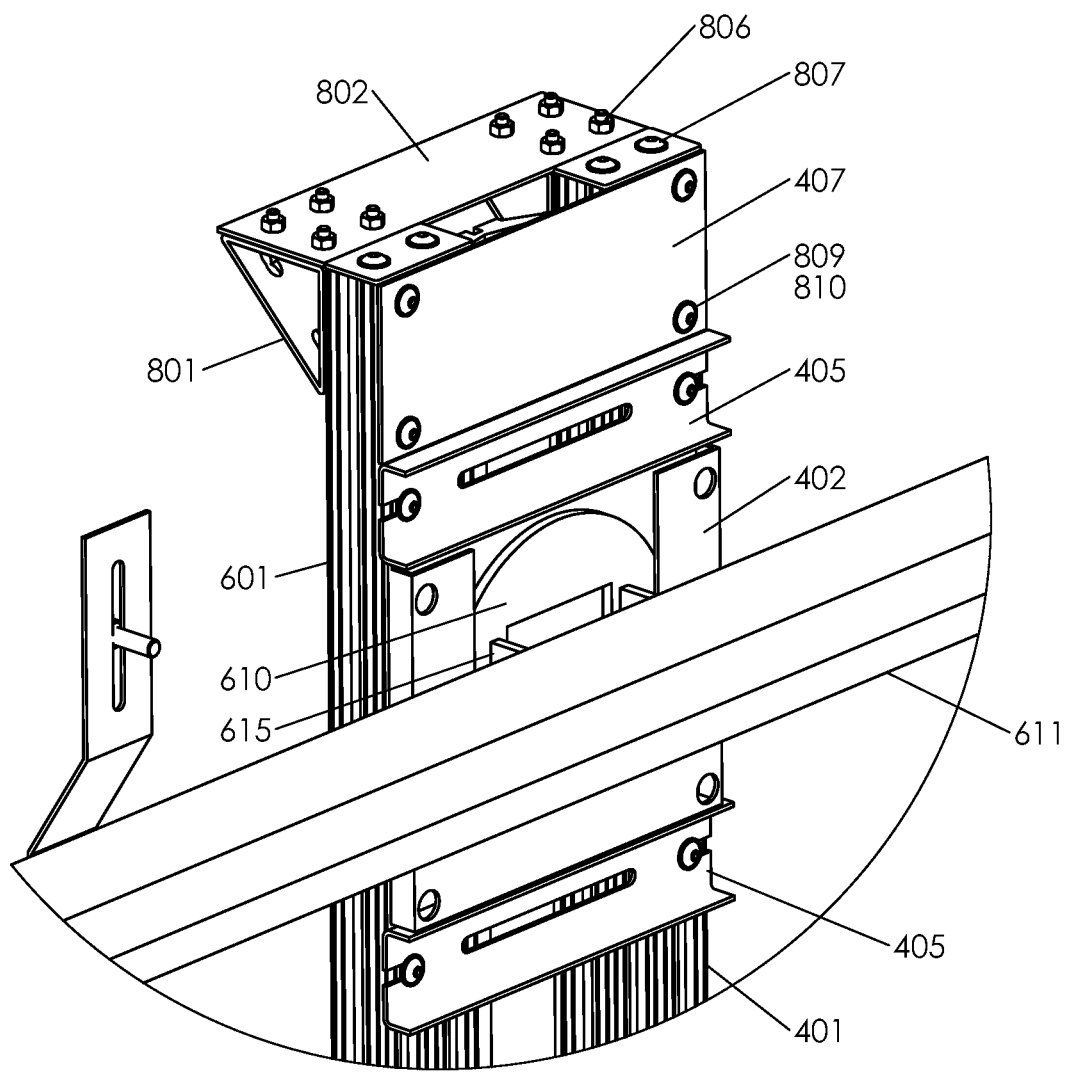
FIG. 22 is a perspective view showing the carriage assembly at the upper limit of travel of an alternate embodiment of the apparatus of the invention.
Figure 23:
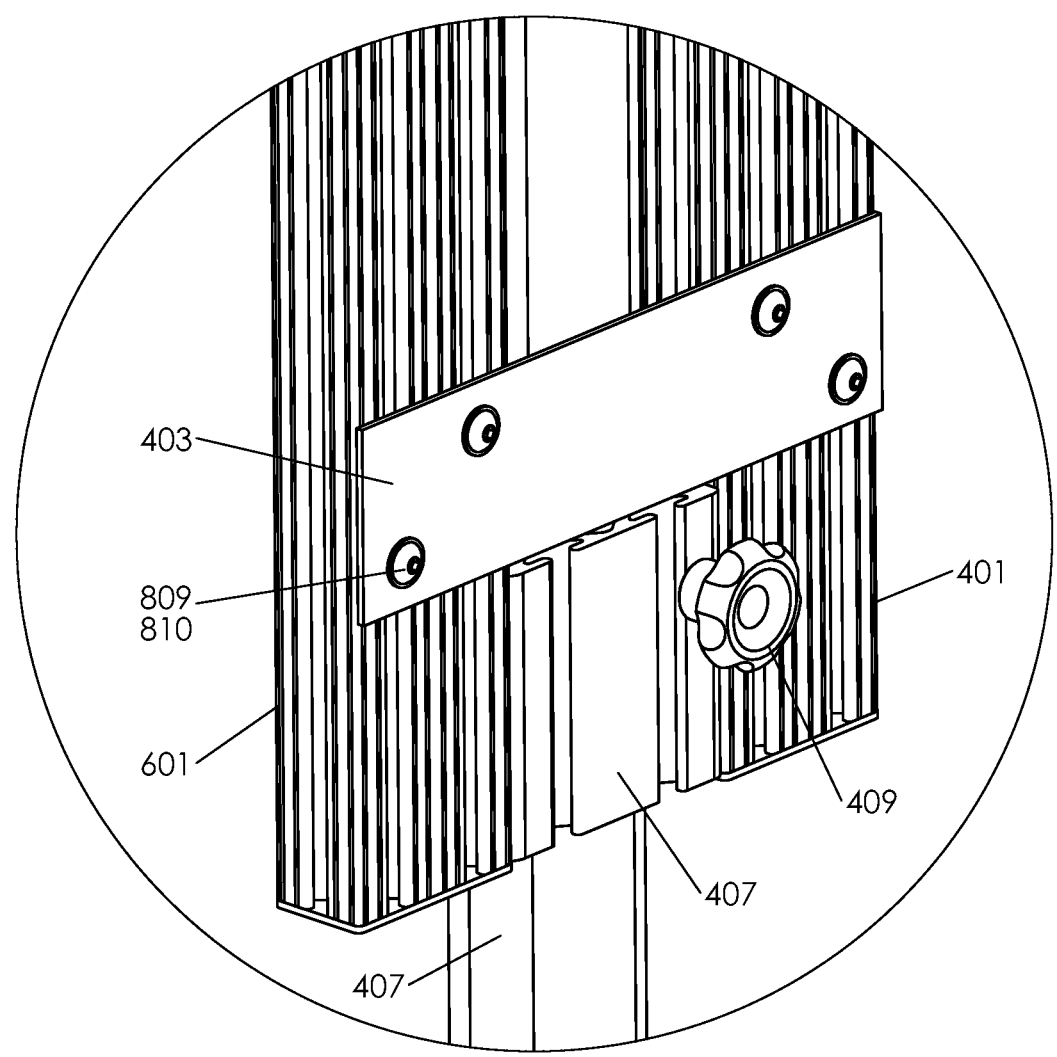
FIG. 23 is a perspective view of the sliding car and lock screw of an alternate embodiment of the apparatus of the invention.
Figure 24:
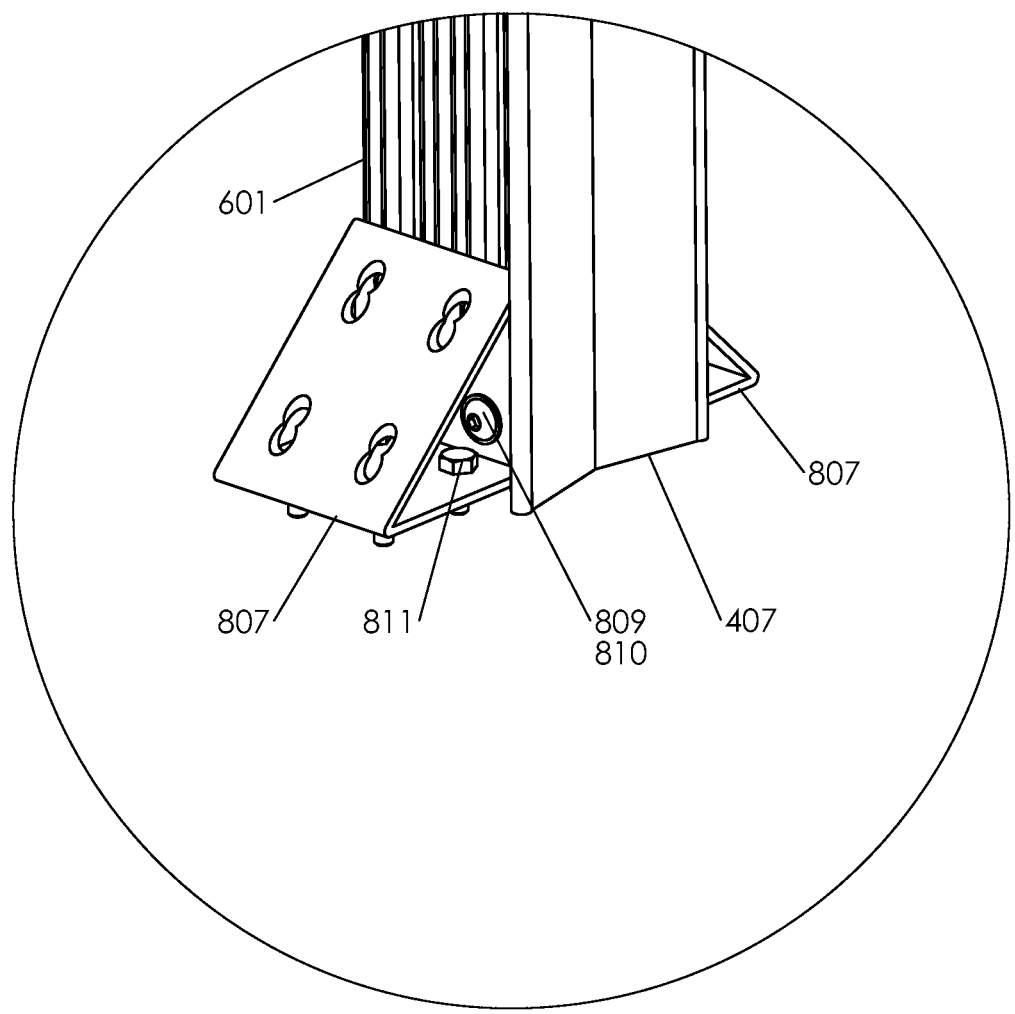
FIG. 24 is a perspective view of lower end of a vertical slide assembly of an alternate embodiment of the apparatus of the invention

Referring now to FIGS. 21-24, perspective views are shown of an alternate embodiment of the invention to provide additional clarity to the disclosure. Referring to FIG. 22, support structure 615 is attached to cradle rotating plate 610 and to vertical support 611 by any means known in the art, including but not limited to welding, chemical bonding, threaded fasteners, or any means known in the mechanical art for attaching structures. In this manner, vertical support 611 is affixed to support structure 615, which is in turn affixed to cradle rotating plate 610. Thus, when display is acted upon encouraging rotation, cradle rotating plate 610 will rotate in cradle 402.

Although a detailed description as provided in the attachments contains many specifics for the purposes of illustration, anyone of ordinary skill in the art will appreciate that many variations and alterations to the following details are within the scope of the invention. Accordingly, the following preferred embodiments of the invention are set forth without any loss of generality to, and without imposing limitations upon, the claimed invention. Thus the scope of the invention should be determined by the disclosed embodiments and their legal equivalents, and not merely by the preferred examples or embodiments given.

What is claimed is:

1. A transportable deployable display apparatus, comprising:
    a first transportation case half having an opening, an inner top surface, an inner bottom surface, an outer bottom surface and an outer back surface and latches;
    a second transportation case half having latches and an opening, and adapted to releasably attach to said first transportation case half, such that when said first transportation case half and said second transportation case half are releasably attached in a transportation position they together form a complete shipping container;
    a vertical slide assembly comprising a vertical slide support attached to said inner back surface of said first transportation case half and attached to said inner bottom surface of said first transportation case half, further comprising a vertical slide rail attached to said vertical slide support wherein said vertical slide rail is adapted to slidingly engage with a sliding car;
    a carriage assembly comprising a sliding car slidingly engaged with said vertical slide rail, and further comprising a cradle adapted to rotatably receive a cradle rotating plate;
    a cradle rotating plate, wherein said cradle and said cradle rotating plate are rotatably engaged, and wherein said cradle rotating plate is adapted to mount to a display; and
    a plate attached to said outer bottom surface of said first transportation case half, said plate having a plurality of casters attached to a bottom surface thereof, each of said plurality of casters comprising a rolling element having a lower surface;
    wherein said second transportation case half opening is capable of being releasably attached to said outer back surface of said first transportation case half; and
    wherein, when said second transportation case half opening is releasably attached to said outer back surface of said first transportation case half, said second transportation case half bottom surface and said first transportation case half bottom surface are not coplanar, and said second transportation case half bottom surface and said rolling element lower surfaces are coplanar and together form a display apparatus support surface capable of rolling.

2. The transportable deployable display apparatus of claim 1, further comprising:
    a display attached to said cradle rotating plate, wherein said display is capable of being translated vertically by operation of said sliding engagement of said sliding car with said vertical slide rail, and wherein said display is capable of being rotated by operation of said rotating engagement of said cradle with said cradle rotating plate, such that said display is capable of being positioned in a display position desired by a user; and
    wherein said display is rotated and translated to a transportation position, said second transportation case half is releasably attached to said first transportation case half while said display is in said transportation position such to form the complete shipping container while completely enclosing said display.

3. The transportable deployable display apparatus of claim 2, wherein said display is an electronic video display.

4. The transportable deployable display apparatus of claim 3, wherein said electronic video display is selected from the group consisting of a plasma display, a liquid crystal display, a light emitting diode display, and an analog display.

5. The transportable deployable display apparatus of claim 3, wherein said display is a static display.

6. The transportable deployable display apparatus of claim 2, further comprising a skirt which substantially encloses said first transportation case half when said display is in said display position.

7. The transportable display apparatus of claim 2 wherein said first transportation case half and said second transportation case are further adapted to be releasably attached in a display position, such that said opening of said second transportation case half is releasably attached to said back surface of said first transportation case half.

8. The transportable display apparatus of claim 3 wherein said first transportation case half and said second transportation case are further adapted to be releasably attached in a display position, such that said opening of said second transportation case half is releasably attached to said back surface of said first transportation case half.

9. The transportable deployable display apparatus of claim 8, further comprising a skirt which substantially encloses said first transportation case half, said second transportation case half, said carriage assembly and said vertical slide assembly when said display is in said display position.

10. A transportable deployable display apparatus, comprising:
   a first transportation case half having an opening, an inner top surface, an inner bottom surface, an outer bottom surface and an outer back surface and latches;
   a second transportation case half having latches and an opening, and adapted to releasably attach to said first transportation case half, such that when said first transportation case half and said second transportation case half are releasably attached in a transportation position they together form a complete shipping container;
   a vertical slide assembly comprising a vertical slide support attached to said inner back surface of said first transportation case half and attached to said inner bottom surface of said first transportation case half, further comprising a vertical slide rail attached to said vertical slide support wherein said vertical slide rail is adapted to slidingly engage with a sliding car;
   a carriage assembly comprising a sliding car slidingly engaged with said vertical slide rail, and further comprising a cradle adapted to rotatably receive a cradle rotating plate;
   a linear actuator having a stationary portion and a moving portion, said stationary portion attached to said inner bottom surface of said first transportation case half, and said moving portion attached to said carriage assembly,
   a controller in electrical communication with said linear actuator, said controller adapted to control the movement of said linear actuator moving portion, and
   a cradle rotating plate, wherein said cradle and said cradle rotating plate are rotatably engaged, and wherein said cradle rotating plate is adapted to mount to a display; and
   a plate attached to said outer bottom surface of said first transportation case half, said plate having a plurality of casters attached to a bottom surface thereof, each of said plurality of casters comprising a rolling element having a lower surface;
   wherein said second transportation case half opening is capable of being releasably attached to said outer back surface of said first transportation case half; and
   wherein, when said second transportation case half opening is releasably attached to said outer back surface of said first transportation case half, said second transportation case half bottom surface and said first transportation case half bottom surface are not coplanar, and said second transportation case half bottom surface and said rolling element lower surfaces are coplanar and together form a display apparatus support surface capable of rolling.

11. The transportable deployable display apparatus of claim 10, further comprising:
   a display attached to said cradle rotating plate, wherein said display is capable of being translated vertically by operation of said sliding engagement of said car with said vertical slide rail, and wherein said display is capable of being rotated by operation of said rotating engagement of said cradle with said cradle rotating plate, such that said display is capable of being positioned in a display position desired by a user; and
   wherein said display is rotated and translated to a transportation position, said second transportation case half is releasably attached to said first transportation case half while said display is in said transportation position such to form the complete shipping container while completely enclosing said display.

12. The transportable deployable display apparatus of claim 11, wherein said display is an electronic video display.

13. The transportable deployable display apparatus of claim 12, wherein said electronic video display is selected from the group consisting of a plasma display, a liquid crystal display, a light emitting diode display and an analog display.

14. The transportable deployable display apparatus of claim 12, wherein said display is a static display.

15. The transportable deployable display apparatus of claim 11, further comprising a skirt which substantially encloses said first transportation case half when said display is in said display position.

16. The transportable display apparatus of claim 11 wherein said first transportation case half and said second transportation case half are further adapted to be releasably attached in a display position, such that said opening of said second transportation case half is releasably attached to said back surface of said first transportation case half.

17. The transportable display apparatus of claim 12 wherein said first transportation case half and said second transportation case are further adapted to be releasably attached in a display position, such that said opening of said second transportation case half is releasably attached to said back surface of said first transportation case half.

18. The transportable deployable display apparatus of claim 17, further comprising a skirt which substantially encloses said first transportation case half, said second transportation case half, said carriage assembly, and said vertical slide assembly when said display is in said display position.

* * * * *